United States Patent
Dada et al.

(10) Patent No.: US 7,228,509 B1
(45) Date of Patent: Jun. 5, 2007

(54) DESIGN TOOLS FOR CONFIGURABLE SERIAL COMMUNICATIONS PROTOCOLS

(75) Inventors: Faisal Dada, Ottawa (CA); Karl Lu, Nepean (CA); Bryon Moyer, Cupertino, CA (US); Arye Ziklik, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 228 days.

(21) Appl. No.: 10/923,352

(22) Filed: Aug. 20, 2004

(51) Int. Cl.
*G06F 17/50* (2006.01)

(52) U.S. Cl. ............................................. 716/1; 11/18
(58) Field of Classification Search ..................... None
See application file for complete search history.

(56) References Cited

U.S. PATENT DOCUMENTS

| | | | | |
|---|---|---|---|---|
| 5,377,122 | A * | 12/1994 | Werner et al. | 716/18 |
| 5,963,454 | A * | 10/1999 | Dockser et al. | 716/18 |
| 6,295,627 | B1 * | 9/2001 | Gowni et al. | 716/1 |
| 6,324,672 | B1 * | 11/2001 | Lawman et al. | 716/1 |
| 6,401,230 | B1 * | 6/2002 | Ahanessians et al. | 716/1 |
| 6,467,072 | B1 * | 10/2002 | Yang et al. | 716/16 |
| 6,490,716 | B1 * | 12/2002 | Gupta et al. | 716/18 |
| 6,976,239 | B1 * | 12/2005 | Allen et al. | 716/16 |
| 7,006,960 | B2 * | 2/2006 | Schaumont et al. | 703/15 |
| 2005/0055657 | A1 * | 3/2005 | Jones | 716/18 |
| 2005/0278682 | A1 * | 12/2005 | Dowling | 716/18 |

OTHER PUBLICATIONS

"IEEE Std 802.3-2002, Section One; Local and Metropolitan Area Networks, Information technology—telecommunications and information exchange between systems—Local and metropolitan area networks—specific requirements—Part 3: Carrier Sense Multiple Access with Collision Detection (CSMA/CD) access method and physica layer specifications." pp. 1-35, (c) 2002 IEEE.
"Draft Supplement to IEEE Std.802.3; IEEE draft P802.3ae/D5.0," May 1, 2002, pp. 295-308.
"Aurora Protocol Specification; SP002(v1.1)," pp. 1-64, protocol specification of Xilinx, Inc. (Feb. 14, 2003).
"InfiniBand Architecture Specification vol. 1, Release 1.1" Nov. 6, 2002, pp. 1-211, Specification of the InfiniBand Trade Association.
"InfiniBand Architecture Specification vol. 2, Release 1.1" Nov. 6, 2002, pp. 1-163, Specification of the InfiniBand Trade Association.

(Continued)

*Primary Examiner*—Leigh M. Garbowski
(74) *Attorney, Agent, or Firm*—G. Victor Treyz

(57) ABSTRACT

A serial communications protocol with optional and adjustable data link layer and physical layer features is provided. A logic design tool for designing circuits compliant with the protocol is also provided. Using the logic design tool, desired optional protocol features may be included to enhance circuit functionality and undesired optional protocol features may be omitted to conserve circuit resources. The logic design tool may include design aids related to retry-on-error timeout calculations, FIFO sizing, transmitter and receiver circuit parameters, and other design parameters. A user of the logic design tool can view information provided by the logic design tool's design aids and can make design selections.

23 Claims, 22 Drawing Sheets

OTHER PUBLICATIONS

"CompactPCI Serial Mesh Backplane Specification; PICMG 2.2 R1.0," Oct. 21, 2002, pp. i-vi, and 1-37 Specification of the PCI Industrial Computer Manufacturers Group.

"CSIX-L1: Common Switch Interface Specification-L1," pp. i-v and 1-63, Aug. 5, 2000 Specification of CSIX of Palo Alto, CA.

"RapidIO Interconnect Specification; Part VI: Physical Layer 1x/4x LP-Serial Specification," Rev. 1.2 Jun. 2000, pp. i-xx, VI-1 to VI-136 and Glossary-1 to Glossary-6.

PCI Express Base Specification, Rev. 1.0app. 34-40 and 119-120, date unavailable.

* cited by examiner

| Element | Latency (cycles) |
|---|---|
| Trigger flow control, pause packet to ALTGXB | 5 |
| Pause packet through ALTGXB TX to wire | 6 |
| Pause packet from wire through ALTGXB RX | 6 |
| Process pause packet, stop transmission | 15 |
| Total = $t_{CP}$ | 32 |

FIG. 10

| Element | Latency (cycles) |
|---|---|
| Remaining data through ALTGXB TX | 6 |
| Remaining data through ALTGXB RX | 6 |
| Remaining data into receive FIFO | 16 |
| Total (no CRC) = $t_{Cd}$ | 28 |
| CRC (if used) = $t_{CRC}$ | 5 |
| Total (with CRC) = $t_{CD}$ | 32 |

FIG. 11

| Data port, optimized against starvation | | |
|---|---|---|
| | Threshold | Headroom |
| Margin | User enters | User enters |
| Core latency | $t_C + t_{CRC}$ | $BF(t_C + t_{CRC}) + BR$ |
| Wire latency | $2t_W$ | $BF(2t_W)$ |
| Pause allocation | $P$ | |

FIG. 12

| Priority port, optimized against starvation | | |
|---|---|---|
| | Threshold | Headroom |
| Margin | User enters | User enters |
| Packet space* | $\dfrac{S_P}{2L}$ | |
| Core latency* | $t_C + t_{CRC}$ | $BF(t_C + t_{CRC}) + BR$ |
| Wire latency* | $2t_W$ | $BF(2t_W)$ |
| Pause allocation | $P$ | |

FIG. 13

| Data port, not optimized against starvation | | |
| --- | --- | --- |
| | Threshold | Headroom |
| Margin | User enters | User enters |
| Core latency | 0 | $BF(t_C + t_{CRC}) + BR$ |
| Wire latency | 0 | $BF(2t_W)$ |
| Pause allocation | 0 | |

FIG. 14

| Priority port, not optimized against starvation | | |
| --- | --- | --- |
| | Threshold | Headroom |
| Margin | User enters | User enters |
| Packet space* | $\dfrac{S_P}{2L}$ | |
| Core latency* | 0 | $BF(t_C + t_{CRC}) + BR$ |
| Wire latency* | 0 | $BF(2t_W)$ |
| Pause allocation | 0 | |

FIG. 15

| Element | Latency (cycles) |
|---|---|
| Data from buffer to ALTGXB TX | 11 |
| Data through ALTGXB TX onto wire | 6 |
| Data from wire through ALTGXB RX | 6 |
| Data from ALTGXB through evaluation | 16 |
| Total (no CRC) = $t_{Cd}$ | 39 |
| CRC (if used) = $t_{CRC}$ | 5 |
| Total (with CRC) = $t_{CD}$ | 44 |

FIG. 19

| Element | Latency (cycles) |
|---|---|
| Ackowledgment to ALTGXB TX | 6 |
| Ackowledgment through ALTGXB TX onto wire | 6 |
| Ackowledgment from wire through ALTGXB RX | 6 |
| Ackowledgment from ALTGXB to timer off | 15 |
| Total (no flow control) = $t_{Ca}$ | 33 |
| Flow control adder (if used) = $t_{FC}$ | 3 |
| Total (with fow control) = $t_{CA}$ | 36 |

FIG. 20

| | |
|---|---|
| Core latency | $t_c + t_{CRC} + t_{FC}$ |
| Wire latency | $2t_w$ |
| Margin | User enters |

FIG. 21

DESIGN TOOLS FOR CONFIGURABLE SERIAL COMMUNICATIONS PROTOCOLS

BACKGROUND OF THE INVENTION

This invention relates to serial communications, and more particularly, to configurable serial communications protocols and tools for designing circuits that are compliant with such protocols.

Serial communications formats are often used in modern electronics systems. Serial communications can be faster than parallel communications, use fewer pins, and, particularly when differential signaling schemes are used, can have higher noise immunity.

High-speed serial communications protocols have historically been designed to ensure interoperability at a high level. This interoperability allows protocol-compliant equipment from various different manufacturers to communicate successfully. Protocols of this type have been fairly rigid and have many required functions.

Some high-level functions in these protocols may be optional. However, even if a function is optional, it may still be necessary to commit resources for the implementation of that function, regardless of whether the function is actually used in practice. In some situations, a function may be omitted, but there is a resulting cost in the form of required start-up negotiations. During these negotiations, both ends of a protocol-compliant serial communications link must communicate to determine which features are supported by the equipment at either end.

Most standard protocols follow some version of the International Standard Organization's (ISO) Open System Interconnect (OSI) reference model in which communications services are provided in layers—i.e., the physical layer, the data link layer, the network layer, the transport layer, the session layer, the presentation layer, and the application layer. Each layer has a set of services that it provides to the layer above it. A typical protocol may specify functionality across a number of OSI layers.

Users that desire a light protocol for communicating across a single data link will not use any layer higher than the data link layer. Reliance on traditional protocols that have optional functions at layers above the data link layer is therefore undesirable. Each of the higher-layer optional features in a traditional serial communication protocol has a potential impact in terms of resource consumption and degradation of performance and latency. Not all situations require these higher-layer features or require them in varying combinations, so it is not desirable to force designers to use them and to accept the overhead they entail.

SUMMARY OF THE INVENTION

In accordance with the present invention, a serial communications protocol is provided that provides support for physical layer features such as the link operating frequency, the number of lanes in a link, lane polarity reversal, and lane order reversal. The protocol also provides support for data link layer features such as data integrity protection (e.g., using cyclic redundancy checking), streaming and packetized data, priority packet nesting, flow control, retry-on-error, and user data channel multiplexing.

These physical layer and data link layer features are optional, which allows a logic designer to decide whether or not a given integrated circuit should include circuitry for supporting them. If these features are implemented on a circuit, the circuit will automatically perform the functions associated with the features. If these features are not implemented on a circuit, resources will be conserved. The optional features may be adjustable (tunable) to allow a user to select how the optional feature will work when implemented in a given design.

A logic design tool is provided for designing integrated circuits compliant with the protocol. The logic design tool helps a user make appropriate design decisions for integrated circuit design parameters that are affected by multiple factors. For example, the logic design tool may help the user select an appropriate size for certain first-in-first-out (FIFO) buffers or may help the user select an appropriate retry-on-error timeout value. Because the user is making design decisions at a fairly low level in the OSI stack when configuring the optional data link layer features and option physical layer features of the protocol, the support provided by the logic design tool can lend valuable assistance to the user.

Further features of the invention, its nature and various advantages will be more apparent from the accompanying drawings and the following detailed description of the preferred embodiments.

BRIEF DESCRIPTION OF THE DRAWINGS

FIG. 10 is a table showing latency contributions to pause core latency in an integrated circuit in accordance with the present invention.

FIG. 11 is a table showing latency contributions to data core latency in an integrated circuit in accordance with the present invention.

FIG. 12 is a table showing factors that affect threshold and headroom in a data port optimized against starvation in accordance with the present invention.

FIG. 13 is a table showing factors that affect threshold and headroom in a priority port optimized against starvation in accordance with the present invention.

FIG. 14 is a table showing factors that affect threshold and headroom in a data port not optimized against starvation in accordance with the present invention.

FIG. 15 is a table showing factors that affect threshold and headroom in a priority port not optimized against starvation in accordance with the present invention.

FIG. 19 is a table showing factors that affect data core latency in accordance with the present invention.

FIG. 20 is a table showing factors that affect acknowledgement core latency in accordance with the present invention.

FIG. 21 is a table summarizing various contributions to a recommended retry-on-error timeout value in accordance with the present invention.

DETAILED DESCRIPTION OF THE PREFERRED EMBODIMENTS

Figure 1:
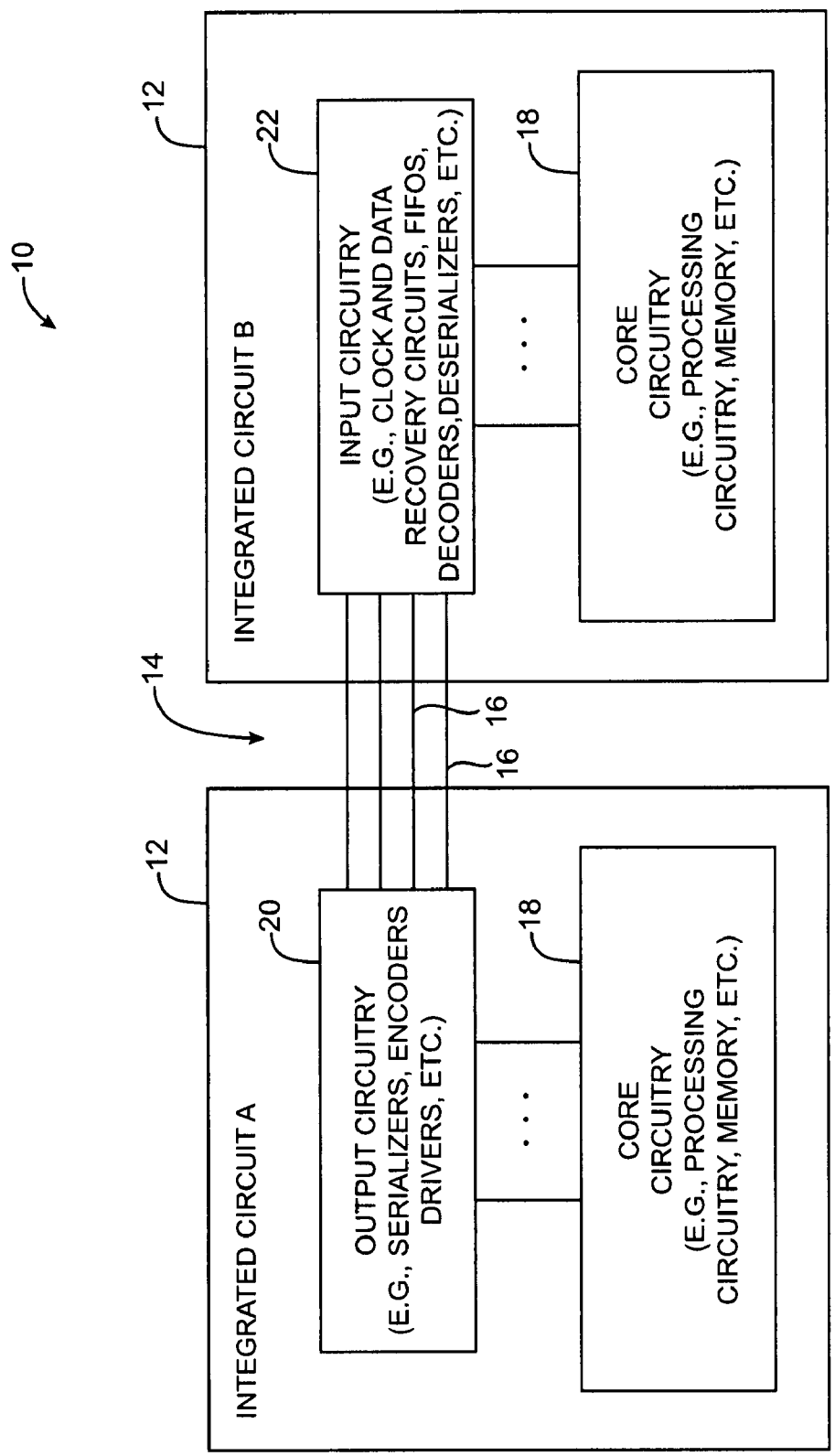
FIG. 1 is a diagram showing how two integrated circuits can communicate over a serial communications link made up of four parallel lanes using a serial communications protocol in accordance with the present invention.

The present invention relates to serial communications protocols and integrated circuits that use serial communications protocols to communicate. More particularly, the present invention relates to a serial communications protocol with configurable data link and physical layer options. A computer-aided logic design tool in accordance with the invention allows a user (e.g., a logic designer or team of logic designers) to design integrated circuits that are compliant with the serial communications protocol.

Using the logic design tool, a user can either conserve integrated circuit resources by forgoing features or can enhance the capabilities of an integrated circuit by implementing features. If the features are implemented, the user can make adjustments to the way in which the features operate.

Serial communications may involve a single path (i.e., a single differential pair of signal wires over which data is conveyed in series) or may involve multiple parallel serial paths (called lanes). In a multi-lane arrangement, a relatively higher-rate serial link is formed from multiple parallel relatively lower-rate serial paths. For example, four lanes operating at about 3.125 Gbps may be used in parallel to support the functions of a 12.5-Gbps serial link. This is merely one illustrative configuration. The data streams from any number of lower-rate serial channels may be combined to form a higher-rate serial link.

Some aspects of the present invention (e.g., lane polarity reversal) relate to the polarity of a pair of differential signal wires in a given lane and apply to both single-lane and multi-lane configurations. Other aspects of the present invention (e.g., automatic lane order reversal) apply to multi-lane configurations. These aspects of the invention may be used either together or separately if desired.

The protocol of the present invention has a number of optional features. If an option is not required, then the logic for that option can be completely omitted from a given integrated circuit implementation. The start-up sequence used when protocol-compliant integrated circuits communicate over a serial communications link in accordance with the present invention need not involve any negotiation between the transmitting and receiving circuits to identify which protocol features are supported. This saves start-up time. In addition, no configuration registers are required to document which features have been implemented.

The protocol is advantageous for users who desire to implement simple high-speed point-to-point links internally, within a complex system. In this type of environment, system interoperability issues are not significant, as the user will generally have exclusive responsibility for determining which integrated circuits will be used on either side of a link.

At design time, if a user creates incompatible integrated circuit designs (for example, if a path has a reversed polarity but the ability to adapt to reversed polarity has not been implemented), the integrated circuits can generate a "catastrophic error." A catastrophic error condition may be used to indicate to the user that the proposed integrated circuit designs will not work together. By using the logic design tool to perform design validation operations and by revising the designs, the user can ensure that the completed system will not encounter catastrophic errors.

Illustrative equipment 10 having two integrated circuits 12 that communicate over a serial communications link 14 is shown in FIG. 1. The integrated circuits 12 may be used in any suitable electronics equipment. For example, each integrated circuit 12 may be mounted on a different line card connected to a common system backplane in rack-mounted data processing or telecommunications equipment. As another example, integrated circuits 12 may be mounted on the same card or may be used in other types of electronic equipment. Each integrated circuit 12 may be, for example, a programmable logic device, a microprocessor, a digital signal processor, an application-specific integrated circuit (ASIC), etc.

Serial link 14 is generally a high-speed link having a data rate of many Gbps, although slower serial links may be used if desired. Link 14 is made up of a number of slower parallel serial links (lanes) 16. Each lane 16 may, for example, be formed from a differential signal path having a pair of conductors that support communications at a serial data rate of a few Gbps. One of the conductors in the pair is generally considered to be the "positive" line and one is considered the "negative" line. If the pair of conductors in a lane is inadvertently flipped, a positive output terminal at integrated circuit A may be electrically connected to a negative input terminal at integrated circuit B and the negative output terminal at circuit A may be connected to the positive input terminal at circuit B. This condition, which is known as lane polarity reversal, causes positive output signals from circuit A to be received as negative signals at circuit B.

Care may be taken to avoid lane polarity reversal conditions when possible. Nevertheless, inadvertent reversal conditions sometimes occur. When one of the circuits (e.g., integrated circuit B) has automatic lane polarity reversal capabilities, that circuit will automatically check for a lane polarity reversal condition and, if reversal is detected, the circuit will automatically reconfigure itself so that the signals are returned to their proper polarity before they are distributed further within the circuit.

The use of multi-lane serial links such as the illustrative four-lane link 14 of FIG. 1 to support communications between chips in an electrical system helps to overcome some of the difficulties associated with handling single-link serial data streams at extremely high data rates (e.g., 10 Gbps), because each of the lanes 16 has a lower data rate than would be required if all of their serial data were passed through a single pair of differential signal conductors.

Because each lane 16 may be connected and routed differently through equipment 10, the data streams on lanes 16 tend to become skewed with respect to each other (i.e., the data bits in one stream will be received at a time that is shifted ahead or behind the data bits of another stream). The different environments of each lane 16 will also generally cause the data streams on each lane to fall out of synchronization with each other. The clock associated with each lane 16 tends to be influenced by environmental factors during transmission. As a result, even if a common clock is used to transmit the signals over lanes 16, the clocks for lanes 16 will no longer be identical when they are received (i.e., the lanes 16 will no longer be synchronized, although their frequencies will be the same). Deskewing and synchronization circuitry may be used to ensure that the data from the lanes is properly reconstructed at the receiving integrated circuit.

Another issue to be addressed concerns lane order. When multiple lanes are used in a link 14, the data from within a sending integrated circuit (e.g., a local circuit A) is distributed among the lanes 16 in a particular order. To properly reconstruct the data at the receiving integrated circuit (e.g., a remote integrated circuit B), the data must be received from each lane in the same order. If lanes are reversed (i.e., if lane 1 at circuit A is connected to lane 4 at circuit B), the link 14 will not function properly. Circuits with automatic lane order reversal capabilities can check to determine whether the order of the lanes within a given link 14 is correct during lane initialization procedures and, if a reversed condition is detected, appropriate corrective actions can be taken (e.g., by automatically reversing the lanes to their proper configuration at the receiving integrated circuit).

The local integrated circuit may insert idle characters to fill gaps in the data being transmitted over link 14 to the remote integrated circuit. This ensures that the link operates properly, even when no actual data is being transmitted in the gaps.

When separate clocks are used to operate the local and remote integrated circuits, the clock speeds of the local and remote integrated circuits will not match exactly. To compensate for this mismatch in clock speeds, the local integrated circuit can insert clock tolerance compensation characters into the outgoing data stream. The clock tolerance compensation characters are discarded at the remote integrated circuit. Because this scheme provides extra ("dummy") characters in the data, a local clock that is faster than a remote clock will not overwhelm the remote circuit with too much data.

Sometimes the logic circuitry on a remote integrated circuit needs additional time to process incoming data. To prevent data from being transmitted too rapidly, the remote integrated circuit can issue flow control signals that direct the local circuit to temporarily stop transmitting data. This allows the remote integrated circuit to "catch up" to the local integrated circuit and prevents unnecessary data loss.

Integrated circuits that communicate over a serial communications link 14 can use a retry-on-error feature to help ensure the successful delivery of data to the remote integrated circuit. With this type of arrangement, each outgoing data packet from a local integrated circuit is labeled with a packet number (packet ID). The remote integrated circuit examines incoming packets to determine whether there has been a transmission problem (e.g., a bad packet or an out-of-order packet). Acknowledgement (ACK) and negative acknowledgement (NACK) signals may be transmitted from the remote integrated circuit to the local integrated circuit to inform the local integrated circuit whether or not packets have been successfully received. The local integrated circuit awaits confirmation from the remote integrated circuit that the transmitted data has been successfully received. If the data has been successfully received, the local integrated circuit can transmit additional data. If the data has not been successfully received, the local integrated circuit can resend the data.

In general, integrated circuits such as circuits 12 of FIG. 1 may have only transmitting circuitry, may have only receiving circuitry, or may have both transmitting and receiving circuitry. In the example of FIG. 1, integrated circuit A has core circuitry 18 that generates data. Output circuitry 20 may be used to serialize the data from core circuitry 18 and to encode the data to embed a clock in each data stream. Drivers in output circuitry 20 may be used to transmit the data from circuitry 18 to integrated circuit B over the multiple parallel lanes 16 of serial link 14.

At the receiving end of link 14, input circuitry 22 can be used to receive the transmitted data. The input circuitry 22 may include clock and data recovery circuits for extracting embedded clock signals, first-in-first-out (FIFO) buffer circuitry for deskewing and synchronizing the incoming data on the parallel lanes 16. Input circuitry 22 may also include decoding circuitry for decoding data that was encoded in output circuitry 20 and deserializers for converting the serial data from lanes 16 to parallel data. The resulting data is provided to core circuitry 18 on integrated circuit B. Core circuitry 18 may be any type of circuitry, including programmable logic, microprocessor circuitry, digital signal processor circuitry, processing circuitry that is part of an application-specific integrated circuit, memory circuitry, etc.

A serial communications protocol in accordance with the present invention preferably supports streaming data and packetized data transmission arrangements, high-priority data packet encapsulation and nesting, and data integrity protection. A user can also establish a desired number of user-defined data channels (data channel multiplexing).

Integrated circuits that are compliant with the serial communications protocol of the present invention can transmit data in either streaming mode or packet mode. In streaming mode, data is transmitted over link 14 without encapsulating the data in packets. This mode may be appropriate, for example, for transmitting large video files. In packet mode, pieces of data are encapsulated in packets. The packets have associated markers which can be used to enable functions such as retry-on-error functions. The streaming and packet modes are preferably optional. A logic designer that can select which of these modes to implement in a given design based on the type of data transmission tasks that need to be handled over the serial link 14.

In packet mode, different types of data may have different associated priority levels. For example, regular data may be transmitted in the form of regular data packets using a regular data port. A priority port may also be provided to allow more important data ("priority data") to be inserted within the regular data, without waiting for a break in transmission. With this type of scheme, priority packets are nested inside of regular data packets. Priority packets are encapsulated between priority packet markers, so that the priority data may be identified as priority data when received and placed on an appropriate priority port at the receiving integrated circuit. The data port and priority port features are preferably optional features.

Data integrity protection may be provided in circuits that are compliant with the serial communications protocol. Data integrity protection is preferably an optional and adjustable feature. This allows a logic designer to select a desired level of protection to implement on a given circuit. A logic designer may, for example, opt to include two-byte (16-bit) cyclic redundancy checking (CRC-16) in a given integrated circuit. Alternatively, the logic designer may chose to implement CRC-32 capabilities or may opt not to include any data integrity protection.

In accordance with the present invention, some of the features of the serial communications protocol (e.g., idle code insertion to fill gaps in transmitted data) are preferably mandatory. If a circuit does not have the ability to insert idle codes into gaps in the transmitted data, the circuit will not be compliant with the serial communications protocols. Optional features may or may not be incorporated into a given design depending on choices made by the logic designer.

With the present invention, data path features such as the streaming/packetized data feature, the priority data nesting feature, and the data integrity protection feature are optional and adjustable features. Because these data path features are optional, a logic designer can either include or not include support for these features while still satisfying the serial communications link protocol. A logic designer who is designing an integrated circuit and who decides to include an optional feature will benefit from the enhanced functionality the feature provides. If the logic designer decides not to include support for the optional feature in a given design, resources on the circuit that would otherwise need to be used for implementing the feature will be available to support other functions. For example, a microprocessor that does not include an optional serial communications feature can generally be constructed using less circuit real estate. As another example, forgoing an optional feature on a programmable logic device will free up programmable logic resources for use in supporting other functions on the device.

Although the present invention may be used in the context of any suitable integrated circuits that use serial communications (i.e., microprocessors, digital signal processors, application specific integrated circuits, etc.), the invention will sometimes be described in the context of programmable logic devices for clarity.

Figure 2:
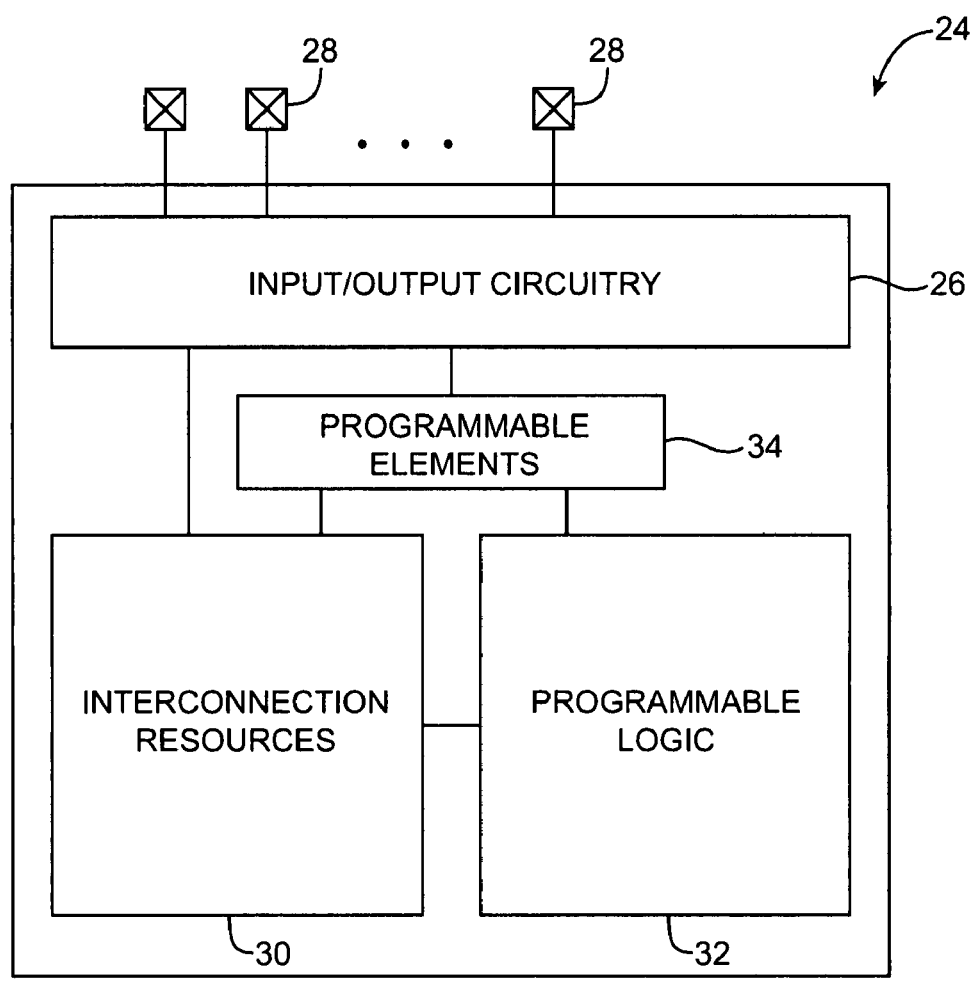
FIG. 2 is a diagram of an illustrative programmable logic device integrated circuit that may communicate using a serial communications protocol in accordance with the present invention.

An illustrative programmable logic device 24 in accordance with the present invention is shown in FIG. 2.

Programmable logic device 24 may have input/output circuitry 26 for driving signals off of device 24 and for receiving signals from other devices via input/output pins 28. Input/output circuitry 26 may include serial communications circuitry such as the output circuitry 20 and input circuitry 22 of FIG. 1. Certain pairs of pins 28 may be associated with respective pairs of differential signal conductors. Each pair of differential signals conductors may be associated with a respective lane 16 (FIG. 1) for supporting high-speed serial communications.

Interconnection resources 30 such as global and local vertical and horizontal conductive lines and busses may be used to route signals on device 24. Programmable logic 32 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers. Some of the logic of programmable logic device 24 is fixed. Programmable logic 32 includes components that may be configured so that device 24 performs a desired custom logic function.

Programmable logic device 24 may be based on any suitable programmable technology. With one suitable approach, configuration data (also called programming data) may be loaded into programmable elements 34 using pins 28 and input/output circuitry 26. The programmable elements (also sometimes called configuration bits or programmable function control elements) may each provide a static control output signal that controls the state of an associated logic component in programmable logic 32.

In a typical arrangement, the programmable elements 34 may be random-access memory (RAM) cells that are loaded from an external erasable-programmable read-only memory chip via certain pins 28 and appropriate portions of input/output circuitry 26. The loaded RAM cells 34 provide static control signals that are applied to the terminals (e.g., the gates) of circuit elements (e.g., metal-oxide-semiconductor transistors) in programmable logic 32 to control those elements (e.g., to turn certain transistors on or off) and thereby configure the logic in programmable logic 32. Circuit elements in input/output circuitry 26 and interconnection resources 30 are also generally configured by the RAM cell outputs as part of the programming process. The circuit elements that are configured in input/output circuitry 26, interconnection resources 30, and programmable logic 32 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 24. Other suitable programmable logic device technologies that may be used for device 24 include one-time programmable device arrangements such as those based on programmable logic elements made from fuses or antifuses, programmable logic devices in which elements 34 are formed from electrically-programmable read-only-memory (EPROM) or erasable-electrically-programmable read-only-memory (EEPROM) technology, or programmable logic devices with programmable elements made from magnetic storage elements, etc.

Regardless of the particular type of programmable element arrangement that is used for device 24, programmable elements are preferably provided with configuration data by a user (e.g., a logic designer). Once provided with configuration data, the programmable elements 34 selectively control (e.g., turn on and off) portions of the circuitry in the programmable logic device 24 and thereby customize its functions so that it will operate as desired.

The circuitry of device 24 may be organized using any suitable architecture. As an example, the logic of programmable logic device 24 may be organized in a series of rows and columns of larger programmable logic regions or areas each of which contains multiple smaller logic regions or areas (e.g., areas of logic based on look-up tables or macrocells). These logic resources may be interconnected by interconnection resources such as associated vertical and horizontal interconnection conductors. Interconnection conductors may include global conductive lines that span substantially all of device 24, fractional lines such as half-lines or quarter lines that span part of device 24, staggered lines of a particular length (e.g., sufficient to interconnect several logic areas), smaller local lines that interconnect small logic regions in a given portion of device 24, or any other suitable interconnection resource arrangement. If desired, the logic of device 24 may be arranged in more levels or layers in which multiple large areas are interconnected to form still larger portions of logic. Still other device arrangements may use logic that is not arranged in rows and columns. Portions of device 24 (e.g., in input/output circuitry 26 and elsewhere) may be hardwired. As an example, hardwired transmitter and receiver circuitry may be used to assist in serial communications functions. Hardwired digital signal processing circuitry (e.g., multipliers, adders, etc.) may also be used.

Figure 3:
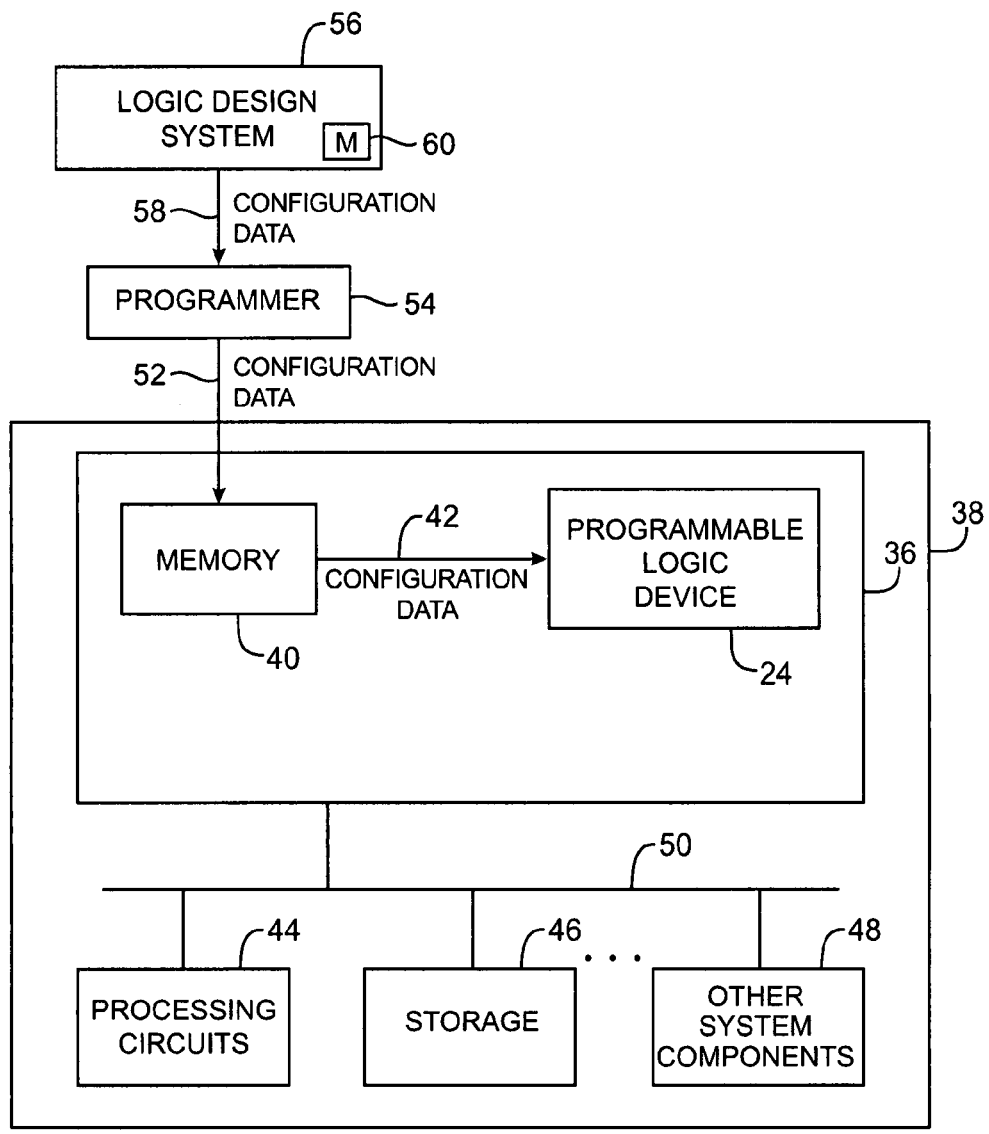
FIG. 3 is a diagram showing how configuration data may be generated for a programmable logic device integrated circuit in accordance with the present invention.

An illustrative system environment for a programmable logic device 24 is shown in FIG. 3. Programmable logic device 24 may be mounted on a board 36 in a system 38. In general, programmable logic device 24 may receive programming data from programming equipment or from any other suitable equipment or device. In the example of FIG. 3, programmable logic device 24 is the type of programmable logic device that receives configuration data from an associated memory chip 40. With this type of arrangement, memory chip 40 may, if desired, be mounted on the same board 36 as programmable logic device 24. The memory 40 may be an erasable-programmable read-only memory (EPROM) chip or other non-volatile memory device. When system 38 boots up (or at another suitable time), the configuration data for configuring the programmable logic device may be supplied to programmable logic device 24 from memory 40 via path 42. The configuration data that is supplied to the programmable logic device may be stored in the programmable logic device in configuration data cells (memory).

System 38 may include processing circuits 44, storage 46, and other system components 48 which may, if desired, contain circuitry that is compliant with the serial communications protocol of the invention. The components of system 38 may be located on one or more boards such as board 36 or other suitable mounting structures or housings and may be interconnected by busses and other electrical paths 50, which may include single-lane and multi-lane serial communications links.

Memory 40 may be supplied with the configuration data for device 24 over a path such as path 52. Memory 40 may, for example, receive the configuration data from a programmer 54 (e.g., an EPROM programmer) or other suitable equipment that stores this data in memory 40.

It can be a significant undertaking to design and implement a desired logic circuit in a programmable logic device and to perform other system design activities. Logic designers therefore generally want to use logic design systems based on computer-aided-design (CAD) tools to assist them in designing circuits and systems. A logic design system can help a logic designer design and test a complex circuit. When a design is complete, the logic design system may be used to generate configuration data for programming the appropriate programmable logic device or mask sets for creating a custom chip.

As shown in FIG. 3, the configuration data produced by a logic design system 56 may be provided to programmer 54 over a path such as path 58. The programmer 54 can program the configuration data into memory 40, so that memory 40 can later provide this configuration data to the programmable logic device 24 over path 42.

In arrangements of the type shown in FIG. 3, the programmable logic device 24 may have configuration data cells formed from memory cells such as static random-access memory cells. This is merely one illustrative arrangement for programming a programmable logic device 24. Any suitable arrangement for programming programmable logic device 24 may be used if desired. For example, programmable logic device 24 may be based on non-volatile configuration data cells such as erasable-programmable read-only memory (EPROM) cells. With this type of arrangement, device 24 can be configured by programming the configuration data into the EPROM cells on the device. Programmable logic device 24 may also be based on programmable elements such as fuses and antifuses or programmable elements based on other technologies (e.g., magnetic devices, etc.).

Regardless of the particular approach used for programming programmable logic device 24, programmable logic device 24 can be configured using configuration data produced by a logic design system 56.

Logic design system 56 includes storage 60. Software is used to implement the functions of system 56. The software may be stored on a computer-readable medium (storage) 60. Storage 60 may include computer memory chips, removable and fixed media such as hard disk drives, flash memory, compact discs (CDs), DVDs, and floppy diskettes, tapes, or any other suitable memory or storage device(s). When the software of system 56 is installed, storage 60 has instructions and data that cause the computing equipment in logic design system 56 to execute various methods (processes). When performing these processes, the computing equipment is configured to implement the functions of the logic design system 56.

Figure 4:
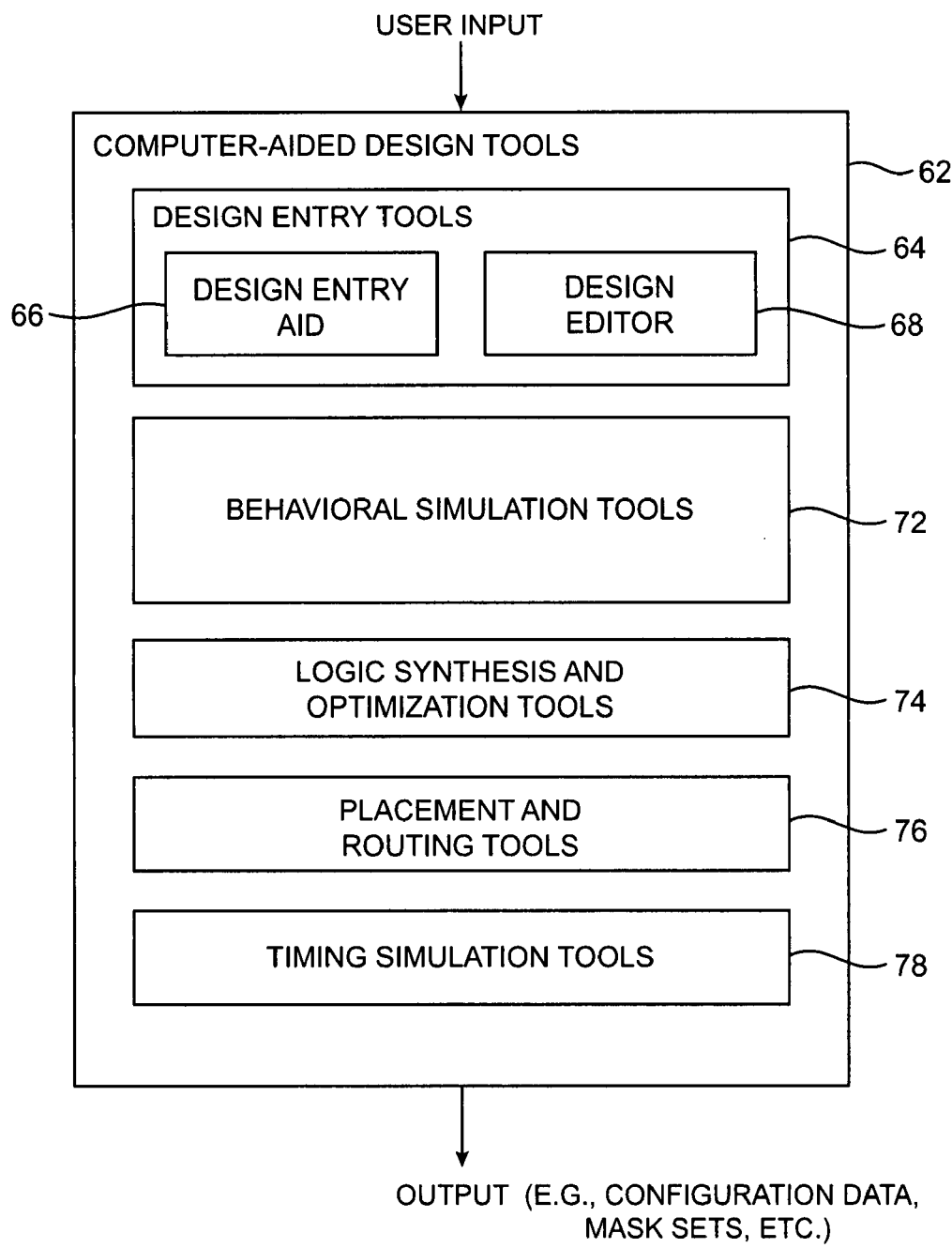
FIG. 4 is a diagram showing how computer-aided design tools may be used to create a logic design based on user input in accordance with the present invention.

Logic design system 56 may use computer-aided design tools such as tools 62 of FIG. 4. Tools such as tools 62 may be used to produce the configuration data for the programmable logic device 24 from a set of design specifications or other suitable input. Tools such as tools 62 can also be used to generate output in other suitable formats (e.g., as specifications for lithographic mask sets for semiconductor fabrication of a desired integrated circuit, etc.).

The design process typically starts with the formulation of logic circuit functional specifications. A logic designer can specify how a desired circuit should function using design entry tools 64. Design entry tools 64 may include tools such as design entry aid 66 and design editor 68. Design entry aids 66 help a logic designer locate a desired design from a library of existing logic designs and may provide computer-aided assistance to the logic designer for entering (specifying) the desired design. As an example, design entry aid 66 may be used to present screens of options for a user. In accordance with the present invention, these on-screen options may allow a user to select which optional serial communications protocol features the user desires to implement in a given logic design. The user may, for example, click on the on-screen options to select whether the circuit being designed should have streaming data capabilities or packetized data capabilities, whether the circuit should have a priority data port (e.g., to nest priority data within regular data), and which data integrity protection features the circuit should have (e.g., no protection, CRC-16 protection, or CRC-32 protection), etc. Design editor 68 may be used to enter a design (e.g., by entering lines of hardware description language code), may be used to edit a design obtained from a library (e.g., using a design entry aid), or may assist a user in selecting and editing appropriate prepackaged code/designs.

Design entry tools 64 may be used to allow a logic designer to provide a desired logic design to logic system 62 using any suitable format. For example, design entry tools 64 may include tools that allow the logic designer to enter a logic design using truth tables. Truth tables can be specified using text files or timing diagrams and may be imported from a library. Truth table logic design entry may be used for a portion of a large circuit or for an entire circuit.

As another example, design entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design entry tools 64 may allow the logic designer to provide a logic design to the logic design system 56 using a hardware description language such as Verilog hardware description language (HDL) or Very High Speed Integrated Circuit Hardware Description Language (VHDL). The logic designer can enter the logic design by writing hardware description language code with editor 68. Blocks of code may be imported from libraries if desired.

After the design has been entered using design entry tools 64, behavioral simulation tools 72 may be used to simulate the functional performance of the design. If the functional performance of the design is incomplete or incorrect, the logic designer can make changes to the design using design entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.)

Once the functional operation of the logic design has been determined to be satisfactory, logic synthesis and optimization tools 74 may be used to implement the logic design in a particular programmable logic device (i.e., in the logic and interconnect resources of a particular programmable logic device product or product family). As an example, if the logic design has serial communications circuitry that supports cyclic redundancy checking, the logic synthesis and optimization tools 74 may decide to use available CRC circuits to perform the desired CRC functions. Tools 74 may, alternatively, implement the CRC functions using a "soft" design—i.e., using mostly or entirely programmable logic resources.

Tools 74 can optimize the design by proper selection of the available hardware to implement different logic functions in the logic design. Often tradeoffs are made because multiple logic functions are competing for limited resources.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable logic device to minimize interconnect delays. The placement and routing tools 76 create orderly and efficient implementations of logic designs for a given programmable logic device.

After an implementation of the desired logic design in the programmable logic device has been generated using placement and routing tools 76, the implementation of the design may be tested using simulation tools such as timing simulation tools 78. Timing simulation tools may, for example, predict the delay times that are associated with certain signal paths through the device. The timing simulation tools may be used to verify that the particular implementation of the design that is being tested does not contain signal paths with delays that are outside of the limits imposed during the design phase. For example, the timing simulation tools may be used to ensure that the slowest data paths are fast enough that the minimum desired clock speed and minimum signal path delay constraints are satisfied. The timing simulation tools may also examine the design for potential race conditions or other conditions that affect device performance.

After satisfactory testing using tools 78, the CAD tools 62 can produce the configuration data for the programmable logic device or can generate other suitable output data (e.g., the specifications for a lithographic mask set for fabricating an integrated circuit incorporating the logic design). Depending on the type of programmable logic device being used (e.g., a device based on non-volatile memory, a device based on volatile memory, a device based on fuses or antifuses, etc.), configuration data may be programmed into the programmable logic device directly or may be provided to a memory device that later (e.g., upon power-up) loads the configuration data into the programmable logic device to program the device.

To assist a logic designer in choosing among data link layer and physical layer options relating to link operating frequency, the number of lanes in a link, lane polarity reversal, lane order reversal, data integrity protection (e.g., using cyclic redundancy checking), streaming and packetized data, priority packet nesting, flow control, retry-on-error, and user data channel multiplexing, the user may click on suitable on-screen options provided by a logic design tool (e.g., a design entry tool 64). The tool may present the user with screens of options with which the user may interact.

The selection of appropriate integrated circuit design parameters when designing a serial communications link at the data link layer and/or the physical layer in the OSI stack can be complex. For example, it can be challenging to select an appropriate size for a first-in-first-out buffer in a receiver and it can be difficult to select correct values to optimize retry-on-error capabilities. Accordingly, the logic design tool (e.g., tool 66) may include design aids such as a FIFO sizer and a retry-on-error aid to assist the user in making appropriate design decisions.

By using on-screen options or by otherwise providing the user with an opportunity to choose which optional features to include in a given integrated circuit design, the computer-aided design tools 62 (e.g., the design entry tools such as design entry aid 66 and/or design editor 68) allow the user to increase functionality (at the expense of increased resource consumption) or allow the user to reduce resource consumption (at the expense of reduced functionality) while still producing a protocol-compliant design.

When the user has finished selecting the desired options for the design, the user may click on a "finish" option. The computer-aided design tools 62 may then be used to complete the design process.

If, for example, the logic designer is designing circuitry to be implemented in a programmable logic device, the computer-aided design tools 62 may be used to complete the design process by producing configuration data for programming a programmable logic device. The configuration data that is created will reflect the inclusion of the desired optional features that have been selected by the user. When loaded into a programmable logic device, the configuration data will configure the programmable logic on the device to implement the desired features while simultaneously configuring the programmable logic on the device so that resources are conserved by not implementing the undesired features. If desired, all of the optional data path features and other serial link communications features may be included or all of these optional features may be omitted.

If the logic designer is designing circuitry for an integrated circuit such as a microprocessor, digital signal processor, or other such circuit (including programmable logic devices) whose serial communications circuitry is exclusively or at least partially hardwired, the output of the computer-aided design tools 62 may be used to complete the design process by producing specifications for a lithographic mask set for fabricating the integrated circuit. The circuitry produced using the mask set will include the desired optional features (and will consume associated resources) and will not include the undesired features (while conserving associated resources).

Figure 5:
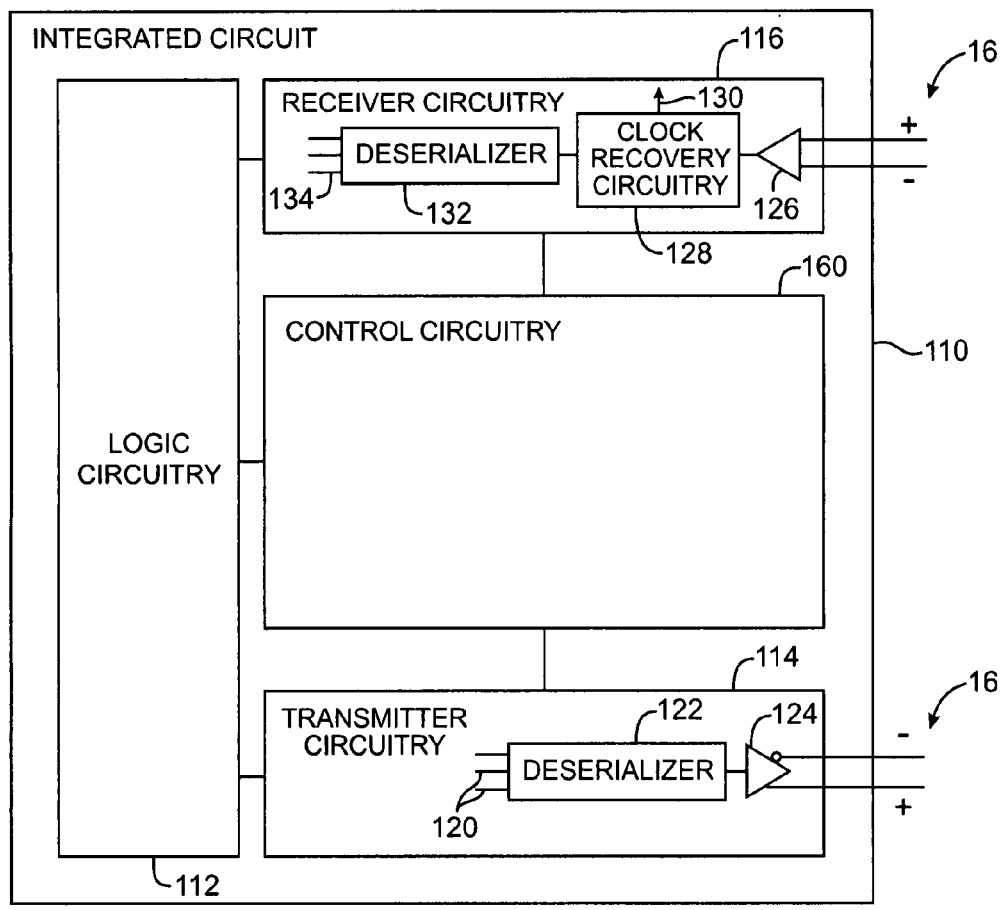
FIG. 5 is a diagram of an illustrative integrated circuit with serial communications circuitry constructed in accordance with the present invention.

A diagram of an illustrative integrated circuit 110 that includes circuitry suitable for performing the optional physical layer and data link layer functions is shown in FIG. 5. Integrated circuit 110 may be a programmable logic device, microprocessor, digital signal processor, application specific integrated circuit, or other suitable integrated circuit. If circuit 110 is a programmable logic device, logic circuitry 112 on integrated circuit 110 will typically include programmable logic such as programmable logic 32 of FIG. 2 and hardwired logic. For other types of integrated circuits, logic circuitry 112 is generally hardwired digital logic circuitry, although programmable logic circuitry may be included in such integrated circuits (e.g., as a programmable block) if desired.

Integrated circuit 110 may transmit digital data signals from logic circuitry 112 to other integrated circuits using transmitter circuitry 114. Receiver circuitry 116 may be used to receive digital data signals for logic circuitry 112 from other integrated circuits.

Transmitter circuitry 114 and receiver circuitry 116 are controlled by control circuitry 160. The circuitry of control circuitry 160 and circuitry 114 and 116 need not be mutually exclusive. For example, data integrity protection circuitry (e.g., cyclic redundancy checking circuitry) may be included in transmitter circuitry 114, receiver circuitry 116, and control circuitry 160. This is merely an illustrative example. In general, the circuitry used to implement the desired data link layer and physical layer functions of circuit 110 may be implemented using any suitable scheme.

Figure 6:
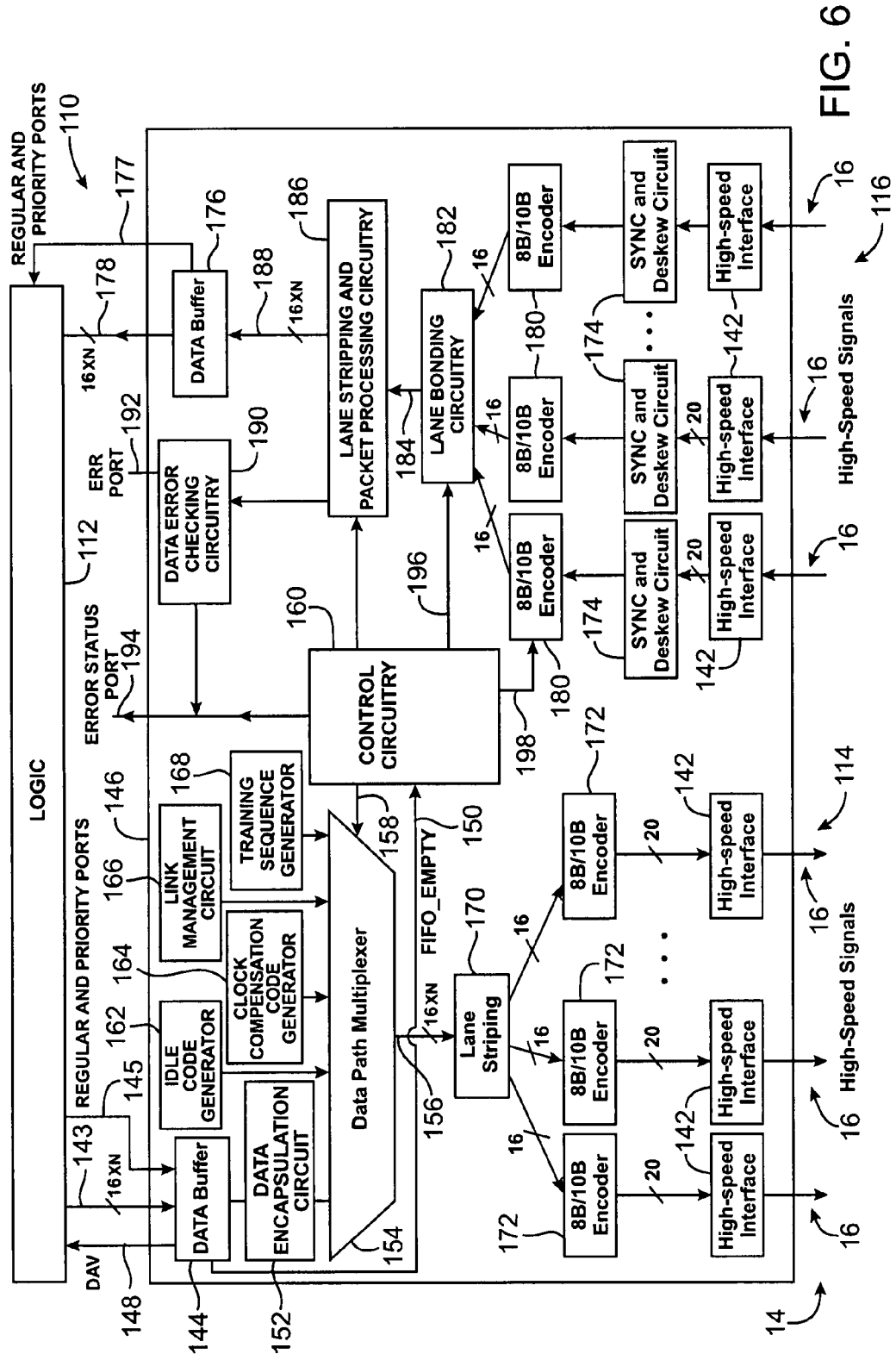
FIG. 6 is a more detailed diagram of an illustrative integrated circuit with serial communications circuitry constructed in accordance with the present invention.

Transmitter circuitry 114 receives signals from logic circuitry 112. Parallel inputs 120 may be used to provide data from logic circuitry 112 to serializer 122. Serializer 122 may serialize parallel data on inputs 120 so that the data can be transmitted over a serial link having one or more lanes. A differential driver 124 may drive serial data from the output of serializer 122 onto two parallel differential signal lines in lane 16. In the example of FIG. 6, there is only a single lane 16 associated with transmitter circuitry 114. This is merely illustrative. In general there may be one or more parallel lanes in a given serial link 14, as shown in FIG. 1.

Receiver circuitry 116 of FIG. 6 has a differential input driver 126 that receives data from another integrated circuit over a lane 16. Only a single lane 16 is associated with the receiver circuitry 116 in the example of FIG. 6. This is merely illustrative. Multiple parallel lanes in a serial link may be associated with receiver circuitry 116 if desired.

The differential data at the two inputs of differential input driver 126 of receiver circuitry 116 is provided to clock-and-data recovery (CDR) circuitry 128. Clock-and-data recovery circuitry 128 extracts embedded clock information from the incoming signal and provides the extracted clock signals at line 130. Recovered serial data is provided to deserializer 132. Deserializer 132 deserializes the data provided by clock recovery circuitry 128 and provides corresponding parallel data at output lines 134. The parallel data from output lines 134 may be distributed to logic circuitry 112.

The receiver circuitry 116, control circuitry 160, and the transmitter circuitry 114 are used to support serial communications in accordance with the serial communications protocol of the present invention. In a given integrated circuit, the amount and type of circuit resources present in circuitry 114, 116, and 160 depends on which optional serial communications features were included by the user. For example, during the design process, the user may have clicked on a "streaming data" data mode option that was presented by tools 64 (FIG. 4). In this case, when the integrated circuit is implemented as a chip, the chip will have control circuitry 160 that includes regular data port circuitry 111 that is capable of handling streaming data. If, however, the logic designer clicked on a "packetized data" data mode option presented by tools 64, the chip will have control circuitry 160 that includes circuitry for handling packetized data rather than streaming data.

Similarly, the logic designer may have clicked on a CRC-16 data integrity protection feature presented by tools 64 during the design process. In this case, when the integrated circuit is implemented as a chip, the chip will have control circuitry 160 that includes circuitry for performing CRC-16 operations. If, however, the logic designer clicked on an option presented by tools 64 that indicates that there should be no data integrity protection, the chip will have control circuitry 160 that does not include circuitry for CRC operations.

The situation is similar for other options. For example, if the user chose to include a regular data port and a priority data port, the circuit will be implemented such that control circuitry 160 includes circuitry that nests priority packets within regular data packets as needed. If the user chose not to include these functions in the design, the circuit will be implemented such that control circuitry 160 does not include the undesired functions.

These different implementations are compliant with the serial communications protocol of the present invention. The implementations with fewer serial communications features will consume fewer logic resources on the integrated circuit and may therefore be less complex and less expensive. The implementations with relatively more (or all) of the features will have added functionality.

An illustrative integrated circuit 110 which may be used to transmit and receive serial data in accordance with the serial communications protocol of the present invention is shown in FIG. 6. Integrated circuit 110 of FIG. 6 has input/output circuitry 146. Input/output circuitry 146 may, for example, be input/output circuitry such as circuitry 26 of FIG. 2 for integrated circuits 110 that are programmable logic devices.

Input/output circuitry 146 of integrated circuit 110 includes serial communications circuitry. For example, input/output circuitry 146 has transmitter circuitry 114 for transmitting data over one or more lanes 16 of serial link 14. Integrated circuit 110 also has receiver circuitry 116 for receiving serial communications from another integrated circuit over one or more lanes 16. High-speed interface circuitry 142 in the transmitter circuitry 114 includes serializer and driver circuitry such as serializer 122 and driver 124 of FIG. 5. High-speed interface circuitry 142 in the receiver circuitry 116 may include components such as the differential input driver 126, clock-and-data recovery circuitry 128, and deserializer circuitry 132 of FIG. 5.

Each lane 16 has two differential signal lines—a positive (+) line and a negative (−) line (shown in more detail in FIG. 5). To support two-way traffic, link 14 has both outgoing pairs of signal lines connected to transmitter circuitry 114 and incoming pairs of signal lines connected to receiver circuitry 116. The number of lanes 16 in link 14 is given by the integer N in FIG. 6. The value of N may be 1 (in a single-lane link) or may be more than 1. As an example, in a four-lane serial link 14 having four outgoing pairs of differential signal lines and having four incoming pairs of differential signals lines, the value of N is 4.

Data to be transmitted over link 14 from integrated circuit 110 to another integrated circuit is passed from logic 112 to data buffer 144 over paths such as path 143. In the example of FIG. 6, data words have 16 bits and the size of path 143 is N×16, where N is the number of lanes in link 14 (as an example).

Buffer 144 may be used to help provide an interface between logic 112 and input-output circuitry 146. When no more data can be accepted from logic 112 because the buffer is full (e.g., because first-in-first out (FIFO) circuitry in buffer 144 is full), the DAV signal on line 148 may be deasserted. Logic 112 may monitor the status of DAV to determine whether or not buffer 144 is ready to accept data. When the FIFO (or other suitable buffer circuitry) in buffer 144 is empty, the FIFO_EMPTY signal on line 150 may be asserted. When control circuitry 160 receives a FIFO_EMPTY signal from data buffer 144, the control circuitry 160 may insert idle codes into the outgoing data.

If desired, data from data buffer 144 may be encapsulated as packets using data encapsulation circuit 152. During the encapsulation process, a data payload may be encapsulated between start-of-packet (SOP) and end-of-packet (EOP) markers.

Regular and priority data can be implemented using data buffer 144. Data buffer 144 may have associated regular and priority data and address ports, shown schematically by line 145 in FIG. 6.

A data path multiplexer 154 or other suitable signal routing circuitry may be used to route the data to be transmitted to the final stages of the transmitter. Data path multiplexer 154 may have multiple inputs and a single output 156.

Control circuitry 160 may control the operation of input/output circuitry 146. For example, control circuitry 160 may control data path multiplexer 154 via control path 158. By controlling which control signals are applied to data path multiplexer 154 via control path 158, the control circuitry 160 can select which of the data path multiplexer's inputs is connected to the output 156. When, for example, it is desired to transmit data from data buffer 144 over link 14, the control circuitry 160 can direct the multiplexer 154 to connect the input connected to data encapsulation circuit 152 to output 156.

Data on the other multiplexer inputs may be routed to output 156 as appropriate. Data from idle code generator 162 may be routed through multiplexer 154 when it is desired to transmit idle codes. Clock tolerance compensation sequences (codes) from clock compensation code generator 164 may be inserted into the transmitted data to compensate for mismatches between the clock of integrated circuit 110 and the clock of the integrated circuit to which data is being transmitted over link 14. The clock compensation codes may be discarded at the receiver of the receiving integrated circuit to accommodate the clock mismatch.

Link management circuit 166 may be used to handle the generation of link management instructions (packets) for flow control operations, retry-on-error operations, etc. Multiplexer 154 may be used to send these link management instructions into the data stream when appropriate. The values of parameters such as the parameters used for the retry-on-error operations performed by circuit 166 and control circuitry 160 may be generated using a retry-on-error aid in the computer-aided logic design tools used to produce a given integrated circuit design.

Training sequence generator 168 may be used to generate training sequences that are used during link initialization. Training sequence generator 168 may, for example, generate a first training sequence called TS1 and a second training sequence called TS2, which are used at various stages of the link initialization process. The training sequences TS1 and TS2 include handshaking information that is used to bring up link 14 during link initialization. Other types of training sequence information can be generated by generator 168 if desired.

Lane striping circuitry 170 may be used to distribute the 16×N bits of parallel data on output 156 among the N lanes 16. Two bytes of data may be distributed among the lanes at a time, which ensures that transmitted data is word aligned. Encoders 172 (e.g., 8B/10B encoders or other suitable encoders) may be used to convert 8-bit bytes of data into corresponding 10-bit coded words. The coded words supplied at the outputs of the encoders have the same information content as the data provided to their inputs. The additional bits in the coded words ensure that there are a sufficient number of high-to-low and low-to-high transitions in the data to allow successful clock extraction at the receiver. At the receiver, circuitry such as clock-and-data recovery circuitry 128 of FIG. 5 can be used to extract the embedded clock signal from the encoded data.

After passing through encoders 172, the outgoing data may be transmitted across link 14 on respective lanes 16 using the serializer and driver circuitry of high-speed interfaces 142. Typically the data being transmitted over link 14 is high-speed data (e.g., data transmitted at data rates of 100 s of Mbps or Gbps).

Incoming data from the integrated circuit at the other end of link 14 may be received by the input drivers, clock-and-data recovery circuitry, and deserializers of the high-speed interface circuitry 142 in receiver circuitry 116. When there is more than one lane 16 of incoming data, synchronization and deskewing circuitry 174 may be used to synchronize and deskew the incoming data so that it can be successfully merged into a single stream of data suitable for transmission to logic 112 via data buffer 176 and path 178. Data buffer 176 may include first-in-first-out (FIFO) buffer circuitry. In a given integrated circuit design, the proper size of the FIFO in buffer 176 may be selected using the FIFO sizer capabilities of the logic design tool. Buffer 176 may be used to implement a regular data port and a priority data port and may have associated data and address ports 177 for regular data and priority data, which may be monitored by logic 112.

Decoders 180 may be used to decode incoming data (e.g., from 10-bit codes to 8-bit data bytes). Lane bonding circuitry 182 may be used to merge multiple lanes of data into a single data path 184. Lane stripping and packet processing circuitry 186 may be used to remove data encapsulation information from the incoming data (e.g., to remove SOP and EOP characters). Stripped data may be provided at output 188.

Data error checking circuitry 190 may be used to check received data for errors (e.g., errors such as cyclic redundancy check (CRC) errors, 8B/10B errors or other decoding errors, etc.). If data error checking circuitry 190 detects an error, a suitable error signal may be generated. For example, an error signal may be asserted on ERR port 192 when an error is detected during retry-on-error operations. If a catastrophic error is detected, a catastrophic error signal may be produced by data error checking circuitry 190 and placed on error status port 194. Control circuitry 160 can also generate catastrophic error signals for port 194 when appropriate. Ports such as port 192 and 194 may be monitored by logic 112.

The way in which the circuitry of FIG. 6 is implemented depends on which optional serial communications link features the logic designer (user) chose when designing the integrated circuit 110 using tools 62. For example, if the user chose to include the flow control feature, the resulting integrated circuit 110 will have flow control capabilities. The optional serial communications link features can be implemented by proper configuration of input/output circuitry 146 (i.e., transmitter circuitry 114, control circuitry 160, and receiver circuitry 116).

Operations such as those involved in handling streaming data and packetized data, priority packet encapsulation and nesting, data integrity protection, link initialization, clock tolerance compensation, flow control, and retry-on-error operations are generally two-sided processes. A local integrated circuit's transmitting circuitry is often transmitting information to receiving circuitry at a remote circuit while transmitting circuitry at the remote circuit is transmitting information to receiving circuitry at the local circuit. To operate a bidirectional serial link 14 between the local and remote circuits, both the local and remote circuits must transmit and receive signals.

Serial communications circuitry constructed in accordance with the serial communications protocol of the present invention may insert idle characters into gaps in the transmitted data. The idle code feature is preferably mandatory (not optional).

If gaps were permitted to remain in the transmitted data, there would be potentially large periods of time during which no signals would be transmitted across link 14. This would disrupt the link, because the phase-locked-loop or delay-locked loop circuitry in the clock-and-date recovery circuit of the receiver would lose frequency lock on the data. As a result, control circuitry 160 preferably uses idle code generator 162 and data path multiplexer 154 (FIG. 6) to insert idle codes into gaps in the transmitted data. The idle codes serve as a type of "dummy data" that keeps the link 14 active even when no actual data needs to be transmitted.

Any suitable characters may be used as idle codes. For example, the idle code generator 162 may produce a preferably randomized sequence of /R/ and /K/ characters at its output with alignment characters /A/ inserted randomly every 16–31 clock cycles. This sequence of idle characters may be used to fill gaps (e.g., by merging these characters into the data path using data path multiplexer 154 of FIG. 6). The randomness of the /R/s, /K/s, and the /A/s reduces electromagnetic interference (EMI) (i.e., radiated noise) on the lines in link 14. When the idle characters are received at the remote end of the link 14, they may be discarded (ignored). The /A/s are used by the deskewing circuitry in the remote receiver to align lanes 16.

The use of idle characters helps ensure that data gaps do not affect the integrity of the link. The use of idle characters is preferably mandatory in integrated circuits that are compliant with the serial communications protocol of the present invention. Other features are optional.

For example, the inclusion of clock tolerance compensation circuitry such as clock compensation code generator 164 in integrated circuit 110 is optional. Circuits can be designed using tools 62 of FIG. 4 that either include or do not include circuitry for compensating for mismatches between local and remote clocks. Both types of circuits will still be compliant with the serial communications protocol of the present invention and will be able to communicate under the proper circumstances.

Clock tolerance compensation circuitry is generally needed when a local integrated circuit and remote integrated circuit do not share a common clock, because there will be a mismatch between clocks that are nominally identical. The clock compensation circuitry can be omitted to save resources when a common clock is available. When clock tolerance compensation circuitry is used, clock tolerance compensation codes are inserted into the transmitted at regular intervals. At the receiver, the inserted codes are discarded. When the remote clock is slower than the local clock, the reception and discarding of the clock compensation codes prevents data from being lost. If the clock compensation codes are not inserted in this type of situation, the faster transmitter may overwhelm the receiver with data.

Another optional serial communications link feature in the serial communications protocol relates to retry-on-error operations. With a retry-on-error scheme, the remote integrated circuit actively acknowledges successfully received data (packets). The local integrated circuit retains transmitted data temporarily in a circular buffer. If the transmitted data is not received properly, it can be retransmitted. The retry-on-error feature, when implemented, therefore helps to ensure successful transmission of data between the local and remote integrated circuits.

When the retry-on-error feature is implemented, data buffer 144 generally includes first-in-first-out (FIFO) buffer circuitry and circular buffer circuitry. Data from logic 112 is initially placed in the FIFO. The circular buffer circuitry may be loaded from the FIFO. The circular buffer consists of discrete "cells", each of which holds a packet. Once the cells are all full, new data cannot be loaded from the FIFO until a cell is cleared.

Data in the circular buffer is transmitted from the local integrated circuit to the remote integrated circuit over link 14. Data is retained in the circular buffer until its reception is acknowledged by the remote integrated circuit. The retained data is available to be retransmitted to the remote integrated circuit in the event of a transmission error.

Each transmitted packet is labeled with a packet number. At the remote integrated circuit, packets are checked. If a bad packet is received or if a packet is received out of order, the remote integrated circuit may ask the local integrated circuit to retransmit the packet. Properly received packets are acknowledged so that the local integrated circuit can load new data into the circular buffer for transmission.

A regular data port and a priority data port are available for implementation by a user. With the regular data port, the user may either stream data or send data as packets. Retry-on-error functionality may be provided by using the priority data port. Use of the priority data port also makes it possible to nest higher-priority data (priority data from the priority port) into regular data (from the regular data port). Data integrity protection is available for users of both the regular data port and the priority data port.

Multiple levels of nesting are permitted. For example, a link management packet (from link management circuit 166 of FIG. 6) may be nested within a priority packet, which in turn is nested within a regular data packet. Clock tolerance compensation sequences have even higher priority than link management packets, so when clock tolerance compensation is implemented, clock tolerance compensation codes can be nested within link management packets.

Computer aided design tools 62 may be used to provide a user with an opportunity to select desired data port and priority port features. When a user chooses to use a streaming data mode (which is available using the data port), the resulting circuit 110 will communicate over link 14 using streaming data. A typical data stream of this type includes streaming data bits intermixed with clock tolerance compensation codes (when the clock tolerance compensation feature has been implemented) and idle codes. Idle codes may be inserted when there is a gap in the data to be transmitted (i.e., data buffer 144 is empty) or when the local control circuitry 160 is temporarily pausing the transmission of data due to reception of a pause signal or other suitable flow control signal from the remote circuit. The streaming data mode may be used in environments in which the addition of the overhead associated with packet encapsulation is not desired.

Data can also be transmitted in packets. Packetized data may be transmitted using either the data port or the priority port. To transmit data in packets, user data from buffer 144 is encapsulated as a packet using data encapsulation circuit 152 (FIG. 6). During encapsulation of data, a pad character is added to the data if the data has an odd length. A pad character is not required when the data to be transmitted has an even length. If cyclic redundancy checking has been implemented, CRC redundancy information may be added to the data following the pad character. Start-of-packet (SOP) marker codes and end-of-packet (EOP) marker codes are placed at the beginning and end of the data to form a completed packet. The packet is then transmitted over link 14, where the SOP and EOP information is stripped, the pad byte is discarded, and error checking operations are performed using the CRC information in the packet.

Data packets sent using the data port are sent using a "cut-through" data flow method. With this approach, packet data is transmitted as soon as sufficient data is available, without waiting for an entire packet to be available to transmitter circuitry 114. The cut-through approach provides low latency for the data path and can be used where latency delays are undesirable. Priority packets may be delivered using a "store-and-forward" data flow method. With the store-and-forward approach, no packet data is transmitted until the entire packet has been provided to the transmitter circuitry 114. Because priority packet data must be received into data buffer 144 before it can be transmitted, the size of data buffer 144 determines the upper limit on the allowable size of a priority packet. There is no limit to the allowed length of regular data packets, which can be particularly beneficial in applications such as medical image processing in which it is often necessary to transport large packets in a burst.

Data transmitted using the priority port will take precedence over data being transmitted using the data port. As a result, priority data packets will be nested within regular data packets when regular and priority data is available for transmission at the same time. In particular, because priority data takes precedence over regular data, the normal transmission of the regular data packet is temporarily interrupted by the transmission of the priority data packet. This results in the priority data packet becoming nested within the regular data packet. In a typical scenario in which a priority packet becomes available for transmission while a regular data packet is being transmitted, the priority packet interrupts the regular data and breaks the regular data packet data payload into two portions. Idle characters and clock tolerance compensation characters may also be inserted in the packets if desired.

Retry-on-error functionality requires a store-and-forward arrangement using a circular buffer. This circular buffer is not implemented in circuit 110 when only a regular data port is implemented. Because regular data is transmitted using a cut-through approach rather than a store-and-forward approach, latency is reduced. This approach may therefore be desired when low latency is an important design consideration. Moreover, because no circular buffer is used with the cut-though method, data packets may be extremely large (essentially unlimited size) and are not limited by the size of the circular buffer. Without the need to support retry-on-error operations, the bits in the SOP markers that would otherwise be used for packet numbering may be put to other uses (e.g., to expand the number of user-labeled data channels a user may implement).

If the user opts to implement only a priority port in circuit 110, all data is priority port data and is packetized. During transmission, a mandatory data encapsulation step is performed to encapsulate the priority data in a packet. During transmission, the circuit 110 may insert idle characters and (if implemented) clock tolerance compensation codes.

If selected by the user, retry-on-error functions can be used to help ensure successful transmission of data over the link. When retry-on-error capabilities are provided, packets are labeled with packet numbers by circuit 110. The packet number information is provided within the priority packet SOP markers, so less of the marker capacity is available for implementing additional features (such as for implementing user-defined channel multiplexing schemes) than would be available if the retry-on-error capabilities were not used. However, the retry-on-error scheme provides a more robust link that is less prone to disruption by errors than schemes without retry-on-error.

Priority data is transmitted through a circular buffer in data buffer 144 using a store-and-forward arrangement. The use of the store-and-forward arrangement allows retry-on-error functions to be implemented, but adds a degree of latency to the transmission process. The circular buffer also imposes a maximum packet size limitation on priority data, because data must be stored in the circular buffer before it is sent. The use of the circular buffer and the store-and-forward data transmission arrangement prevents the priority data port from being used to handle streaming data. If a user desires to stream data over link 14, the regular data port may be used.

Three different levels of data integrity protection are available: (1) no protection, (2) CRC-16, and (3) CRC-32. These are illustrative levels of data integrity protection that may be implemented using the serial communications protocol of the invention. Other suitable arrangements may use fewer levels of protection, may use more levels of protection, or may be implemented using a different type of redundancy algorithm.

When no data integrity protection has been implemented, the data payload and an optional pad byte may be encapsulated between SOP markers and EOP markers. There is no redundancy information for performing error checking associated with the packet. Because no data integrity protection capabilities are required, the circuitry for performing cyclic redundancy checking operations or other suitable data error checking functions may be omitted from the receiver circuitry 116, thereby reducing the amount of resources consumed by integrated circuit 110.

When a first level of data integrity protection has been implemented (e.g., using a 16-bit cyclic redundancy check (CRC-16) arrangement. CRC operations are performed on the data before it is transmitted to produce CRC-16 redundancy data, which contains compressed information on the data payload. The redundancy data may be encapsulated between the SOP and EOP markers of the packet with the data payload and optional pad byte. After the data packet has been transmitted over link 14, the redundancy information and contents of the data payload can be compared using data error checking circuitry 190 (FIG. 6) to determine whether the transmission of the data packet over link 14 has introduced any errors.

A stronger form of CRC redundancy may be provided using a 32-bit CRC arrangement. With this type of arrangement, 32-bits of CRC redundancy information are provided in the transmitted packets. The CRC redundancy information, data payload, and optional pad byte are encapsulated between SOP and EOP markers before transmission of each packet over link 14.

At the remote integrated circuit, receiver circuitry 116 is used to receive the transmitted data packets. If error correction has been implemented, the CRC-16 or CRC-32 information may be used to help determine whether there has been an error in the transmission of the data over link 14.

When receiving regular (non-priority) data transmitted from a regular data port on a local circuit to a regular data port on a remote circuit, data is first accepted into the receiver 116 of the remote circuit. The SOP and EOP markers are the stripped from the incoming packet using lane stripping and packet processing circuitry 186. If the CRC-16 or CRC-32 redundancy information is present, that information can be used by data error checking circuitry 190 to determine whether the transmitted data payload has an error. If the received regular data payload is determined to have an error, an RERR signal is asserted on ERR port 192 and a data error signal is generated on error status port 194. This alerts logic 112 that a data error on the regular data port error has been detected. If the received regular data payload is determined not to contain any errors, the pad byte may be stripped (if it was present) and the received data may be passed to the regular data port buffer circuitry in data buffer 176 (i.e., the FIFO in buffer 176).

When receiving priority data packets transmitted from a priority data port on a local circuit to a priority data port on a remote circuit when the retry-on-error function has not been implemented, SOP and EOP markers are stripped from the incoming packet using lane stripping and packet processing circuitry 186. If CRC-16 or CRC-32 redundancy information is present, it can be used by data error checking circuitry 190 to check whether the transmitted data payload has an error. If the received priority data payload is determined to have an error, an RHERR signal is asserted on ERR port 192 and a data error signal is generated on error status port 194. This alerts logic 112 that a data error on the priority data port has been detected. If the received priority data payload is determined not to contain any errors, the pad byte may be stripped (if it was present) and the received data may be passed to the priority data port buffer circuitry in data buffer 176 (e.g., FIFO in buffer 176).

When receiving priority data packets transmitted from a priority data port on a local circuit to a priority data port on a remote circuit when the retry-on-error function has been implemented, the SOP and EOP markers are stripped from the incoming packet using lane stripping and packet processing circuitry 186. If CRC-16 or CRC-32 redundancy information is present, it can be used by data error checking circuitry 190 to check whether the transmitted data payload has an error. If the received priority data payload is determined to have an error, retry-on-error resend operations may be performed and data error signals may be generated. Performing the retry-on-error operations provides the transmitting circuit with another opportunity to transmit the data without errors. If the received priority data payload is determined not to contain any errors, the pad byte may be stripped (if it was present) and the received data may be passed to the priority data port buffer circuitry in data buffer 176.

The serial communications protocol of the invention allows users to selectively implement an optional data channel multiplexing feature. With this feature, the user may define multiple "channels" in link 14. Each channel serves as an independent bus and may be used to transmit a different type of data across link 14 (for example). A given data packet must belong exclusively to a single channel, but other packets can belong to different channels. The number of channels used bears no relation to the number of lanes 16 in link 14. For example, multiple user-defined data channels may be used in links 14 that contain only a single lane.

A channel number is associated with each user-defined channel. At the local integrated circuit, the channel number may be embedded into the SOP marker information associated with each packet. Up to 256 independent data channels may be defined by the user when the regular data port is used. When the priority port is used, some of the SOP marker information is used for labeling packet numbers for retry-on-error operations. Less room is therefore available in the SOP fields of priority packets for use in channel numbering. As a result, when the priority port is used, up to 16 independent data channels may be defined.

The user-defined data channel multiplexing feature allows the user to convey data on one or more separate channels on link 14 at the link layer. The data channel information embedded in the SOP markers is used to identify which packets are associated with which data channels. If desired (e.g., if the data channel multiplexing feature is not being used in this way), the data channel label bits may be used to convey other user data.

To assist the user in designing protocol-compliant integrated circuits, the logic design tools 62 (FIG. 4) may include design aids. For example, a logic design tool may include a FIFO sizer aid. The FIFO sizer aid may help the user determine an appropriate size for the receive FIFO (i.e., the FIFO in the data buffer 176). The logic design tool may also include a retry-on-error aid that assists the user in setting retry-on-error parameters for the circuits appropriately.

The appropriate size for the receive FIFO depends on a number of factors. Flow control and latency play important roles. FIFO sizing (and latency) are affected by settings such as bit rate, lane count, wire delay, packet/streaming mode (indirectly—because CRC is not available in streaming mode), CRC, maximum priority packet size, flow control, backup flow control, pause delay, optimization against starvation, and the number of packets to be held in priority port receive FIFO.

The bit rate has an influence on receive FIFO size, because the bit rate determines the wire latency (which is expressed as a delay).

Lane count determines the width of the FIFO, which affects how many entries are required to hold a packet (priority port only).

Wire delay determines wire latency.

CRC affects core latency.

The priority packet size influences FIFO sizing, because the priority FIFO must hold at least one full packet of data. It also matters whether or not priority packets are to be tested, as changes to this setting can change the value of the maximum packet size.

Flow control settings also affect FIFO size. Without flow control, there are no triggers/thresholds to consider. With flow control, extra FIFO space may be allocated above the primary flow control threshold to support a backup threshold.

FIFO size also depends on whether or not the FIFO is optimized against starvation. Pause delay affects FIFO size when optimizing to avoid starvation.

The number of packets for which space is to be guaranteed in the priority FIFO also has an impact, as do any margins that the user wants to add to the threshold and/or headroom of the FIFO.

Figure 7:
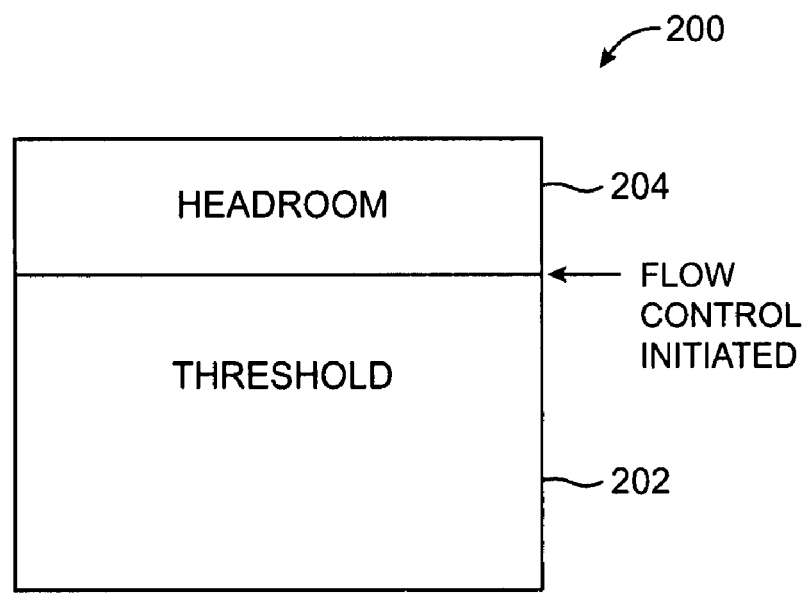
FIG. 7 is a diagram showing how a FIFO is composed of headroom and threshold components in accordance with the present invention.

As shown in FIG. 7, the receive FIFO 200 may be divided into two sections: the section below the threshold, referred to simply as threshold 202, and the section above the threshold, referred to as headroom 204.

The threshold is the point at which flow control is initiated. The headroom is the space required to ensure that the FIFO does not overflow while flow control is being initiated.

The threshold and headroom can be calculated separately. The desired FIFO size is the sum of the threshold and headroom. The threshold setting is different for the data and priority ports, so they may be considered separately.

There are a number of factors that make up the FIFO calculations. These factors include margin, core latency, wire latency, pause allocation, and packet space.

Margin can generally be any suitable number and can be entered by the user.

Core latency is the latency contribution due to the core itself. Core latency is dictated by the logic 112 and is not generally considered to be under the control of the user.

Wire latency is the latency due to the physical medium connecting the two ends of the link 14. Wire latency is under the control of the user.

Pause allocation also affects FIFO size. In some circumstances, a portion of FIFO space must be reserved for pause allocation. This reserved portion may be proportional to the pause delay that is selected.

Packet space affects FIFO size because for priority ports sufficient space must be reserved for at least one packet.

An illustrative technique for using these factors to size the receive FIFO on a protocol-compliant integrated circuit is described below. This is merely one illustrative way in which the receive FIFO may be sized. Any suitable FIFO sizing algorithm may be used if desired.

In general, there is no requirement for any size of the threshold 202 for the data port. The smaller the threshold 202, the more often flow control will be initiated.

If it is desired to avoid starvation during flow control, then the threshold has a definite minimum size. The initiation of flow control is predicated on data arriving while not being read. The worst case starvation scenario is that immediately as flow control is initiated, reading commences and data stops arriving. Now data is being consumed and is not being replenished. If the FIFO does not hold enough data, reading will halt after the FIFO empties (is starved) while waiting for the pause to expire. This is wasted time. A better use of time would have been to provide more space in the FIFO. This delays the initiation of flow control, but allows the entire pause time to be used reading data if circumstances permit.

Figure 8:
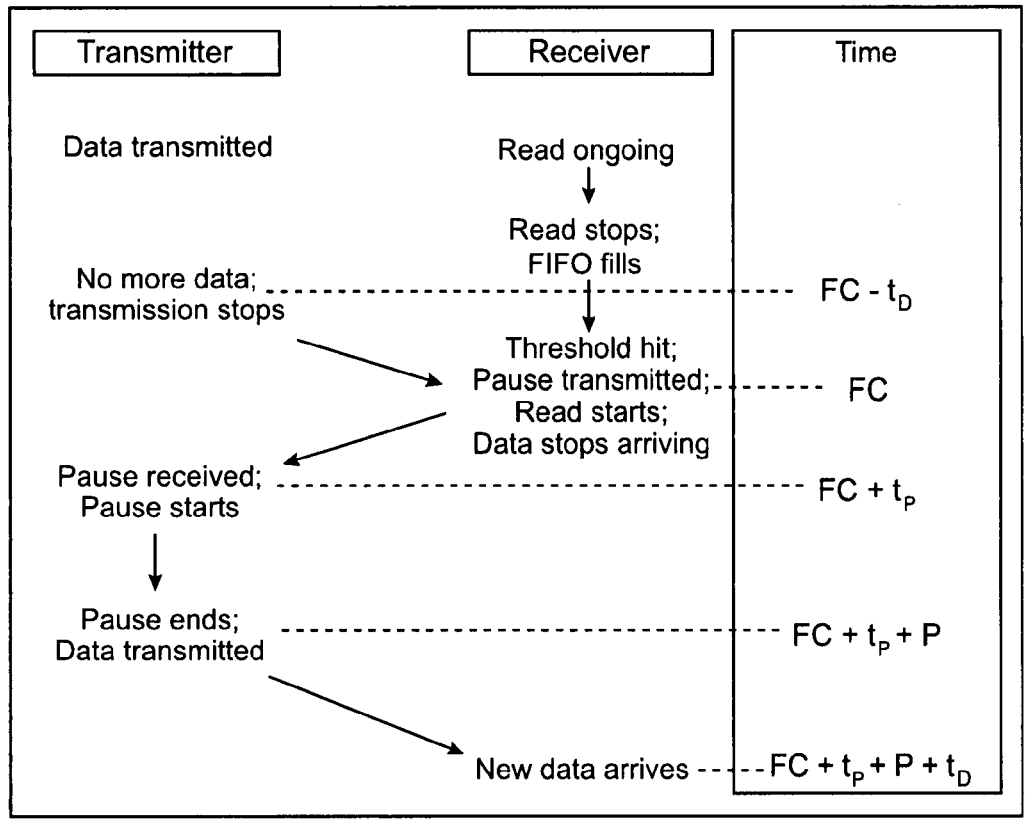
FIG. 8 is a diagram showing factors that affect appropriate threshold size when an optional flow control feature has been implemented in the data port of an integrated circuit in accordance with the present invention.

The worst case scenario is shown in FIG. 8. Data transmission stops at time $FC-t_D$. Due to a stop in the read process, the FIFO fills at FC before the data stops arriving. When the FIFO threshold is exceeded, a pause instruction is transmitted at FC, starting flow control. Independently, the data stops arriving and the read restarts. From this point on, data is being removed from the FIFO, but no new data is being written into the FIFO. The goal in optimizing FIFO size to avoid starvation is to ensure that the FIFO is large enough so that it does not empty (is not starved) before the pause expires and new data arrives.

Once the pause is initiated, it takes a pause packet transit time $t_P$ to arrive at the transmitter and take effect. A pause delay P later, the pause ends, and data transmission restarts. A data transit time $t_D$ later, new data arrives at the FIFO.

The minimum FIFO threshold size would have the FIFO empty just as the new data arrives, ensuring no idle read cycles. This means that the threshold size must be large enough to hold data through the time from flow control initiation through new data arrival, with one entry equaling one clock cycle. The data port threshold size must therefore be as shown in equations 1a, 1b, and 1c $$S_{TD} = \text{(Data arrival time)} - \text{(Flow control initiation time)} \quad (1a)$$

$$S_{TD} = (FC + t_P + P + t_D) - FC \quad (1b)$$

$$S_{TD} = t_P + P + t_D \quad (1c)$$

The analysis for the data port also holds for the priority port. However, there is an additional consideration for the priority port: its FIFO must be large enough to hold at least one full maximum-sized packet. This is due to requirements for retry-on-error. Moreover, in an illustrative arrangement, this restriction is enforced whether or not retry-on-error is selected.

Because the priority port uses a store-and-forward mechanism, the receiving circuit must receive and evaluate an entire packet before deciding whether to ask for a retransmission of the packet. If an entire packet is not in place when flow control is initiated, then a) no decision on data validity can be made, meaning that no reading can take place, so the FIFO will never empty, and b) the remaining data required to decide whether the packet was received correctly and can therefore be read cannot be sent because transmission has been paused. The FIFO must therefore allow at least one full packet to be stored to guarantee that reading will occur, allowing the FIFO to be emptied during flow control.

The number of entries required for a packet depends on bus width, which may be determined by the lane count. In general, for a packet size $S_P$ and lane count L, the packet-size requirement for the FIFO threshold size $S_T$ is as shown in equation 2.

$$S_T = S_P / 2L \quad (2)$$

This requirement occurs independently of the starvation criteria discussed above. If no optimization for starvation is desired, then the packet size determines the minimum FIFO size. If starvation is to be avoided, then for large packets, the FIFO will be large enough simply due to the packet requirement to satisfy the starvation requirement. For small packets, the starvation requirement will be large enough to satisfy the packet requirement. In other words, the minimum priority FIFO size will be the larger of the packet requirement and the starvation requirement, as shown by equation 3.

$$S_{TP} = \max(S_P/2L, t_P+P+t_D) \quad (3)$$

The headroom calculations for data and priority ports are the same. The calculation does depend, however, on whether or not a backup threshold is desired. This section discusses the situation when no backup threshold is used.

Figure 9:
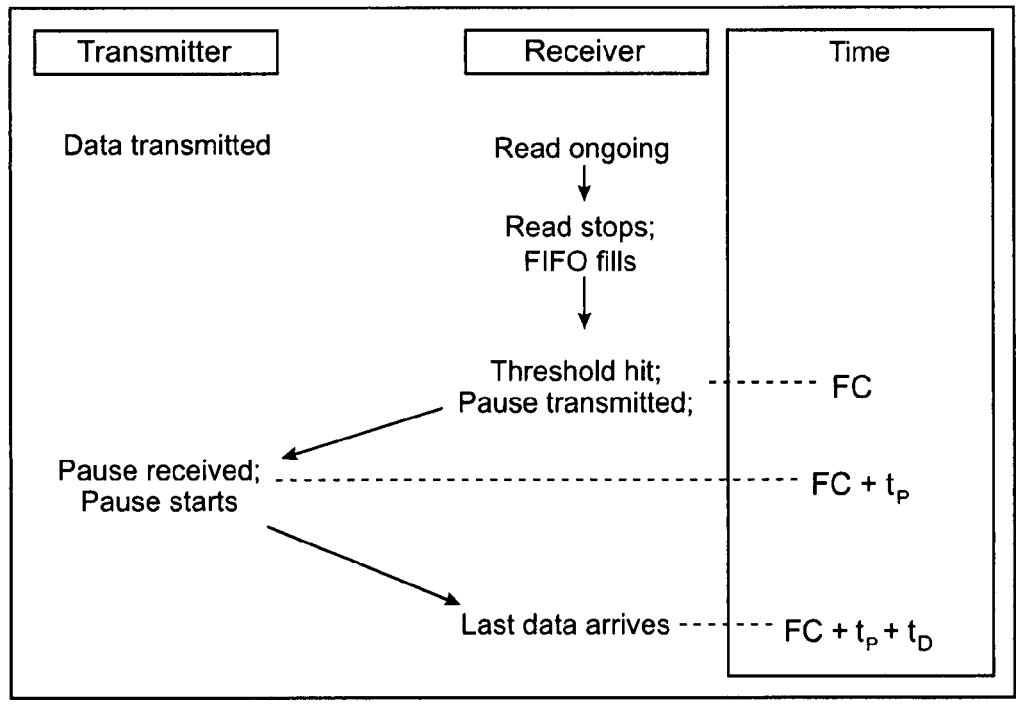
FIG. 9 is a diagram showing factors that affect appropriate headroom size in an integrated circuit in accordance with the present invention.

The purpose of the headroom is to ensure enough room to process residual data while flow control is initiated. This includes both the time required to initiate the pause process on the other end of the link as well as the time to absorb any in-flight data remaining in the system after transmission is paused. This is illustrated in FIG. 9 and is set forth in equations 4a and 4b for the situation when no backup threshold is used.

$$S_{HnB} = (FC+t_P+t_D) - FC \quad (4a)$$

$$S_{HnB} = t_P+t_D \quad (4b)$$

If desired, a backup threshold may be used. The purpose of the backup threshold is to act as a failsafe if the initial pause instruction is lost, corrupted, or otherwise does not take effect. A second threshold is created high enough that if the first (or primary) threshold is effective, the backup threshold will never be reached. This is equivalent to the reasoning used to determine the headroom size above, except that the threshold should be triggered one cycle beyond that limit.

Beyond that, just in case the backup threshold is used, enough headroom must be included above the backup threshold so that the FIFO never overflows. This is the same calculation as the headroom calculation just derived. The total headroom required when a backup threshold is used is therefore given by equations 5a, 5b, and 5c:

$$S_{HB} = \text{(headroom between primary and backup threshold)} + \text{(headroom above backup threshold)} \quad (5a)$$

$$S_{HB} = (t_P+t_D+1)+(t_P+t_D) \quad (5b)$$

$$S_{HB} = 2t_P+2t_D+1 \quad (5c)$$

The total FIFO size is the sum of the threshold and headroom numbers. Specifically, assuming optimizing against starvation, the FIFO sizes are as given in equations 6–9.

For the data port with no backup configuration, the FIFO size is given by equations 6a and 6b.

$$S_{FDnB} = (t_P+P+t_D)+(t_P+t_D) \quad (6a)$$

$$S_{FDnB} = 2t_P+2t_D+P \quad (6b)$$

For the data port with backup configuration, the FIFO size is given by equations 7a and 7b.

$$S_{FDB} = (t_P+P+t_D)+(2t_P+2t_D+1) \quad (7a)$$

$$S_{FDB} = 3t_P+3t_D+P+1 \quad (7b)$$

For the priority port with no backup configuration, the FIFO size is given by equation 8.

$$S_{FPnB} = \max(S_P/2L, t_P+P+t_D)+(t_P+t_D) \quad (8)$$

For the priority port with backup configuration, the FIFO size is given by equation 9.

$$S_{FPnB} = \max(S_P/2L, t_P+P+t_D)+(2t_P+2t_D+1) \quad (9)$$

These are minimum FIFO sizes. The user can add margin to the primary threshold or the headroom to increase the FIFO size up to its limit if desired. In one illustrative arrangement, the user is not allowed to add margin specifically to the backup threshold.

As mentioned above, if not optimizing against starvation, the threshold for the data port can be arbitrarily low (although the lower the threshold the greater the frequency of flow control). The priority port threshold is determined solely by $S_P/2L$.

The primary thresholds are the thresholds calculated above. The backup thresholds, if used, are the incremental values added to the headroom to account for the second threshold. Specifically, if optimizing against starvation, the data port thresholds are given by equations 10, 11a, and 11b, while the priority port thresholds are given by equations 12 and 13.

$$T_{DnB} = t_P+P+t_D \quad (10)$$

$$T_{DB} = (t_P+P+t_D)+(t_P+t_D+1) \quad (11a)$$

$$T_{DB} = 2t_P+2t_D+P+1 \quad (11b)$$

$$T_{PnB} = \max(S_P/2L, t_P+P+t_D) \quad (12)$$

$$T_{PB} = \max(S_P/2L, t_P+P+t_D)+(t_P+t_D+1) \quad (13)$$

There are fewer considerations for the FIFOs in the absence of flow control.

For the data port, there is theoretically no minimum size. However, a specific implementation may require some space for a "look-ahead" to flag a FIFO overflow some number of cycles before it actually overflows. This flag may be used either to help initiate flow control or to cause a link error if no flow control is used. In order for this arrangement to be effective, the FIFO must be at least as deep as the look-ahead requirement.

In the priority port, the one-packet minimum size for the priority FIFO still applies, because retry-on-error can be used with or without flow control. The user can also add some margin to create a custom FIFO size. With one suitable arrangement, there are two ways to accomplish this: either by specifying an appropriate integral number of packets for which to guarantee space (with a minimum of one required), or by specifying an appropriate number of entries to add to the required minimum, or both, up to the maximum FIFO size. The transit times $t_P$ and $t_D$ reflect latency in both the core itself and in the physical medium connecting the two ends of the link. Core latency ($t_C$) is a fixed property of the core and is out of the control of the user. The latency of the medium, (referred to herein as wire latency $t_W$), is preferably under the sole control of the user. At typical speeds, wire latency cannot be ignored. It may or may not be significant.

One may treat the delays required to send and process a pause packet ($t_P$) as being distinct from those required to send and process payload data ($t_D$). The difference is accounted for by core latency differences. The core latencies used are specifically determined for the function in question. For example, the data latency used in this model does not reflect the full data latency from the IN port to the OUT port of the data and priority ports, since the path in question is concerned solely with transferring data into the receive FIFO, and not beyond. As a result, the relationships of equations 14 and 15 generally hold.

$$t_P = t_{CP}+t_W \quad (14)$$

$$t_D = t_{CD}+t_W \quad (15)$$

Note that latency may not be deterministic. There may be some inherent variability of the latency of the FIFOs and other elements used in the design, there may be some uncertainty due to the link management packet queue, and there may be uncertainty in the event that two competing link management packets need to be executed. The numbers in the following illustrative discussion assume the worst case for one suitable configuration, and do not attempt to account for the variability. Other suitable configurations may use different numbers and/or calculations.

Pause core latency must account for the time it takes to trigger flow control, obtain a pause packet generated and onto the wire, receive the pause packet on the other side, process the pause packet, and stop transmission. Factors that contribute to pause control latency in a typical configuration are shown in FIG. 10.

Data core latency must account for the time it takes to get remaining in-flight data onto the wire and reabsorb it on the other end into the receive FIFO. CRC may add to the data latency, so it may be considered separately because it is an optional feature. In other suitable configurations, other optional features might contribute to latency variability, and may be considered separately. The CRC feature can be enabled in only one direction or in both directions (i.e., when transmitting from the local circuit to the remote circuit, when transmitting from the remote circuit to the local circuit, or in both of these situations). From the perspective of the receive FIFO being sized, the CRC only enters into the latency due to the absorption of in-flight data. The CRC latency would therefore only be included if CRC is enabled in the receive direction (or both directions). The factors that contribute to data core latency are shown in FIG. 11, where, assuming $t_{CRC}$ takes on the value 0 if CRC is not used in the receive direction, the total data core latency $t_{CD}$ is given by equation 16.

$$t_{CD}=t_{Cd}+t_{CRC} \quad (16)$$

Given the latency numbers in FIG. 11, we can make the following simplifications by noting that in all equations, $t_P$ and $t_D$ are added together equally. Defining $t_C$ as the total core latency, not including the effect of CRC, yields equations 17a, 17b, 17c, and 17d.

$$t_P+t_D=(t_{CP}+t_W)+(t_{CD}+t_W) \quad (17a)$$

$$t_P+t_D=(t_{CP}+t_{CD})+2t_W \quad (17b)$$

$$t_P+t_D=(t_{CP}+t_{Cd})+t_{CRC}+2t_W \quad (17c)$$

$$t_P+t_D=t_C+t_{CRC}+2t_W \quad (17d)$$

For the numbers in FIG. 11, we can substitute 28 for $t_{CP}$ and 32 for $t_{Cd}$, making $t_C$ equal to 60, as shown in equations 18a and 18b.

$$t_P+t_D=(32+28)+t_{CRC}+2t_W \quad (18a)$$

$$t_P+t_D=60+t_{CRC}+2t_W \quad (18b)$$

To further collapse the equations used, we can further define a backup factor (BF), assigning it the value 2 if backup is used, and 1 if not used. We also define a backup residual (BR) that will have the value 1 if backup is used and 0 if backup is not used.

We can now derive the final forms of all the calculations.

For the data port threshold portion, optimized against starvation, we have equations 19a, 19b, and 19c.

$$S_{TD}=t_P+P+t_D \quad (19a)$$

$$S_{TD}=t_P+t_D+P \quad (19b)$$

$$S_{TD}=t_C+t_{CRC}+2t_W+P \quad (19c)$$

For the data port headroom portion, we have equations 20 and 21a and 21b.

$$S_{HnB}=t_P+t_D \quad (20)$$

$$S_{HB}=2t_P+2t_D+1 \quad (21a)$$

$$S_{HB}=2(t_P+t_D)+1 \quad (21b)$$

This can be generalized to give equations 22a and 22b.

$$S_H=BF(t_P+t_D)+BR \quad (22a)$$

$$S_H=BF(t_C+t_{CRC}+2t_W)+BR \quad (22b)$$

Separating core from wire factors (as they may be displayed for a user separately when the user is interacting with the logic design tool), we have equation 23.

$$S_H=BF(t_C+t_{CRC})+BR+BF(2t_W) \quad (23)$$

For the priority port threshold portion, optimized against starvation, we have equations 24a, 24b, and 24c.

$$S_{TP}=\max(S_P/2L, t_P+P+t_D) \quad (24a)$$

$$S_{TP}=\max(S_P/2L, t_P+t_D+P) \quad (24b)$$

$$S_{TP}=\max(S_P/2L, t_C+t_{CRC}+2t_W+P) \quad (24c)$$

For the priority port headroom portion, we have equation 25 (the same as for the data port).

$$S_H=BF(t_C+t_{CRC})+BR+BF(2t_W) \quad (25)$$

The FIFO sizing criteria can be presented to the user by the logic design tools 62 and may be summarized as shown in FIGS. 12, 13, 14, and 15. As noted by the * in FIG. 13, if the packet space is larger than the sum of core and wire latency, then the logic design tool may, if desired, enable the packet space option presented to the user while disabling the core and wire latency options. With this type of illustrative arrangement, the total that is displayed will only contain the packet space information. Conversely, if the sum of core and wire latencies is greater than the packet space, the core and wire latency boxes will be enabled in the graphical user interface presented by the logic design tool and the packet space option will be disabled. With this type of arrangement, the total will only reflect the core and wire latencies and not the packet space.

If not optimizing against starvation, then the minimum threshold values change:

The formulas for the primary and backup thresholds of FIGS. 12, 13, 14, and 15 are given in equations 26–33.

For the data port, optimized for starvation, the primary threshold is given by equation 26 and the backup threshold is given by equation 27.

$$\text{primary}=t_C+t_{CRC}+2t_W+P \quad (26)$$

$$\text{backup}=2(t_C+t_{CRC})+4t_W+P+BR \quad (27)$$

For the priority port, optimized for starvation, the primary threshold is given by equation 28 and the backup threshold is given by equation 29.

$$\text{primary}=\max(S_P/2L, t_C+t_{CRC}+2t_W+P) \quad (28)$$

$$\text{backup}=\max(S_P/2L, t_C+t_{CRC}+2t_W+P)+t_C+t_{CRC}+2t_W+BR \quad (29)$$

For the data port, not optimized for starvation, the primary threshold is given by equation 30 and the backup threshold is given by equation 31.

$$\text{primary} = t_C + t_{CRC} + 2t_W + P \qquad (30)$$

$$\text{backup} = 2(t_C + t_{CRC}) + 4t_W + P + \text{BR} \qquad (31)$$

For the priority port, not optimized for starvation, the primary threshold is given by equation 32 and the backup threshold is given by equation 33.

$$\text{primary} = SP/2L \qquad (32)$$

$$\text{backup} = SP/2L + t_C + t_{CRC} + 2t_W + \text{BR} \qquad (33)$$

For optimum resource usage, care should be taken not to oversize the FIFO. There are a number of factors that affect the size of the FIFO. When the FIFO size itself is being changed by the user (i.e., when the user uses the logic design tool to modify the margin), it is relatively straightforward to verify that the size of the FIFO is within predetermined bounds. However, once set, other changes could push the FIFO size back out of bounds.

Assuming that the FIFO is sized to a predetermined maximum value, a number of different events could push the FIFO over its allowed maximum.

For example, if flow control is not selected, then selecting flow control will add latency components to the FIFO, increasing the size.

If CRC in the receive direction (or both directions) was not selected, then selecting CRC in the receive direction (or both) will increase core latency, increasing FIFO size.

If the packet size is increased, then the priority FIFO will grow in size.

If the number of lanes is reduced, then the width of the data port and priority port bus will decrease, decreasing the width of the FIFO. This leads to less data per FIFO entry, so that more entries are required to hold the same packet size. The priority FIFO will therefore grow in size.

If the pause duration is increased, then when optimizing against starvation, the FIFOs will grow in size.

If the number of packets for which priority FIFO space is to be guaranteed is raised, then the FIFO will grow in size.

If a backup pause has not been selected, and is then selected, the headroom will increase, raising the FIFO size.

If not optimizing against starvation, then if optimization is later selected, the threshold will grow, raising the FIFO size.

If the bit rate is set low, and in particular if the wire delay is high and then the bit rate is increased, then the same wire delay will correspond to a higher wire latency (i.e., more cycles), increasing FIFO size.

If the wire delay is increased, then the wire latency increases, increasing FIFO size.

If the data port is in packet mode with CRC enabled, the mode is changed to streaming mode (which disables CRC), and then the FIFO size is maximized and the mode is set back to packet, the CRC may turn back on (if remaining from the previous setting), increasing core latency and the FIFO size.

These potential factors for increasing FIFO size can be handled using any suitable arrangement. With one suitable approach, the logic design tool reduces the user-entered margin enough to reset the total FIFO size to the maximum. The amount of margin that must exist to have a FIFO of this size may be so large that in practice there will always be plenty of margin from which to deduct. If not, the tool may let the user choose how to reduce the size.

When flow control is used, there may be two margins—one for threshold and one for headroom. When the margin is automatically adjusted, it may be deducted from the larger of the two.

If desired, the logic design tool may inform the user of any margin adjustments.

If the user attempts to size the margin directly in a manner that makes the FIFO too large, the user entry may be replaced automatically by the maximum allowable number under the circumstances (taking into account all of the contributors to FIFO size for that configuration). The logic design tool notifies the user that this is taking place. (In one suitable arrangement, most other user entry errors do not result in an error notification, rather the user is simply allowed to try again to enter the correct data.) Providing the maximum FIFO size for the user automatically is advantageous, because it avoids requiring the user to manually calculate a maximum size and enter it manually. If desired, the user can manually override the automatically-provided maximum FIFO size number that is provided by the logic design tool.

The logic design tool (e.g., tools 62 and tool 66 of FIG. 4) may provide FIFO sizing assistance to the user using any suitable arrangement. With one suitable arrangement, a FIFO sizer module (or modules) are used in the logic design tool to take into consideration the factors listed above (e.g., the FIFO sizing factors described in connection with equations 1–33).

Figure 16:
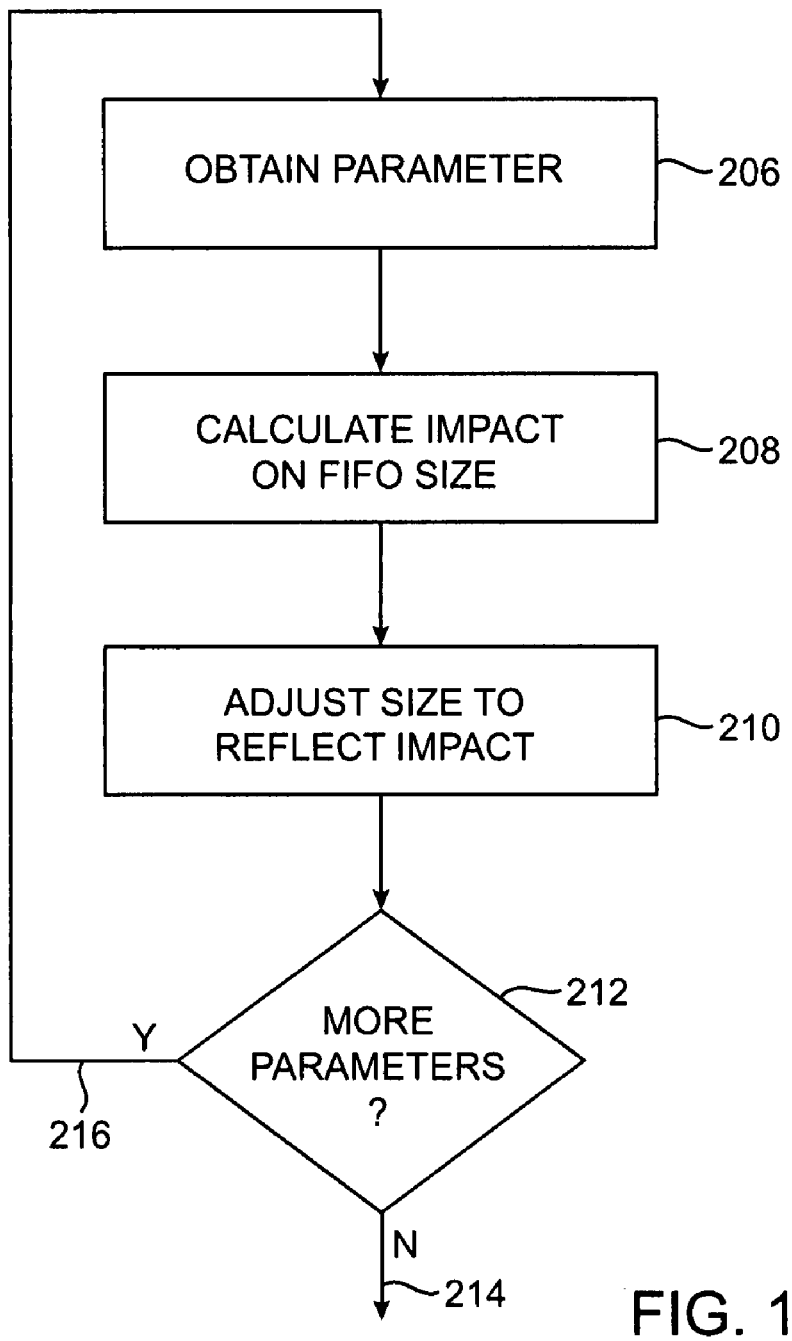
FIG. 16 is a flow chart of illustrative steps involved in computing a recommended FIFO size in accordance with the present invention.

Illustrative steps involved in using the logic design tool to assist a user in appropriately sizing the receive FIFO on a protocol-compliant integrated circuit are shown in FIG. 16. At step 206, the FIFO sizer obtains a parameter that affects FIFO size. The parameter may be an item entered by a user, may be a predetermined (or default) value, or may be a parameter derived from user and/or default values. Parameters that affect FIFO size are described in connection with equations 1–33 and, in one suitable embodiment, may include: bit rate, lane count, wire delay, packet/streaming mode (indirectly due to the fact that CRC is not available in streaming mode), CRC, maximum priority packet size, flow control, backup flow control, pause delay, optimization against starvation, and number of packets to be held in priority receive FIFO.

At step 208, the FIFO sizer calculates the impact the parameter(s) will have on FIFO size and at step 210, the size of the FIFO is adjusted to reflect this calculation.

At step 212, the logic design tool determines whether the impact of additional parameters is to be taken into account. If not, the logic design tool proceeds to other processes via path 214. If additional parameters are to be taken into account, the FIFO sizing process loops back to step 206, as shown by path 216.

Figure 17:
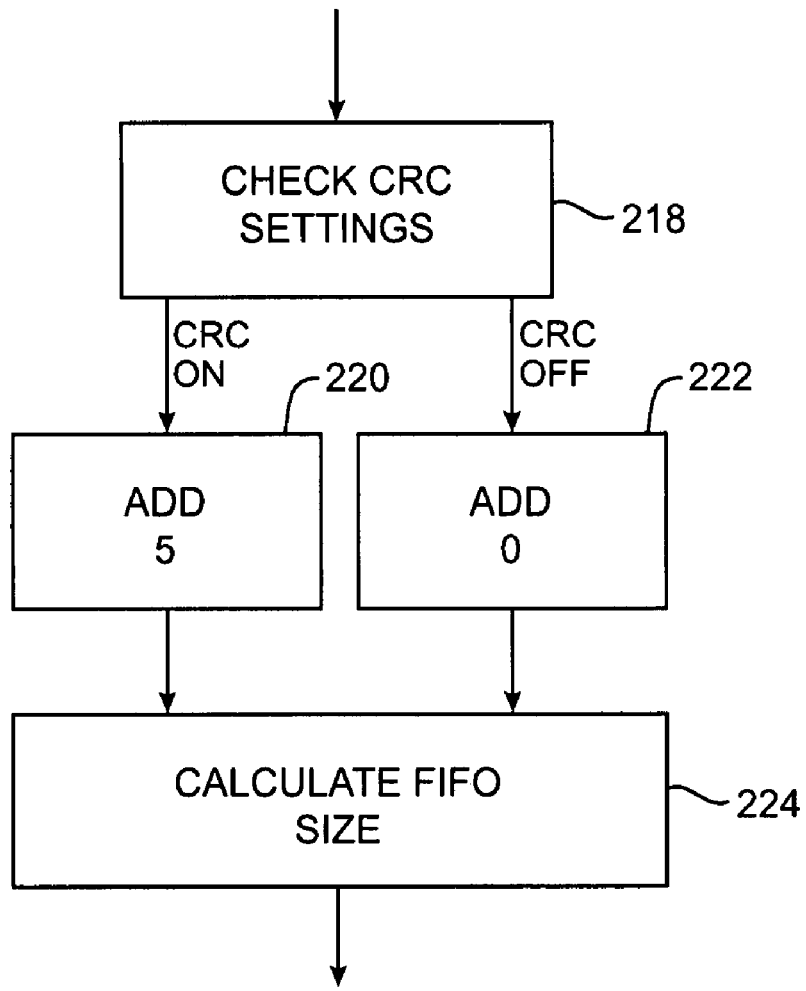
FIG. 17 is a flow chart of illustrative steps involved in computing a recommended FIFO size based on whether or not a user chose to include an optional CRC feature in an integrated circuit in accordance with the present invention.

An illustrative FIFO sizing process based on considering CRC settings is shown in FIG. 17 as an example. At step 218, the FIFO sizer module (or modules) in the logic design tool checks the CRC settings for the design under consideration. If CRC has not been implemented in the design, there is no impact on FIFO size at step 222. If, however, CRC has been selected for implementation, at step 220, the impact of the CRC option is calculated.

At step 224, the FIFO size is calculated using the results of step 220 or 222 as appropriate.

Another aspect of designing protocol-compliant integrated circuits that benefits from aid by the logic design tool concerns the retry-on-error function. In order for retry on error to work properly, the retry-on-error timeout value must be set high enough to ensure that there is sufficient time for acknowledgment before the timeout occurs. The logic design tool can take this into account by setting a minimum required timeout value and allowing the user to lengthen the timeout if desired.

Figure 18:
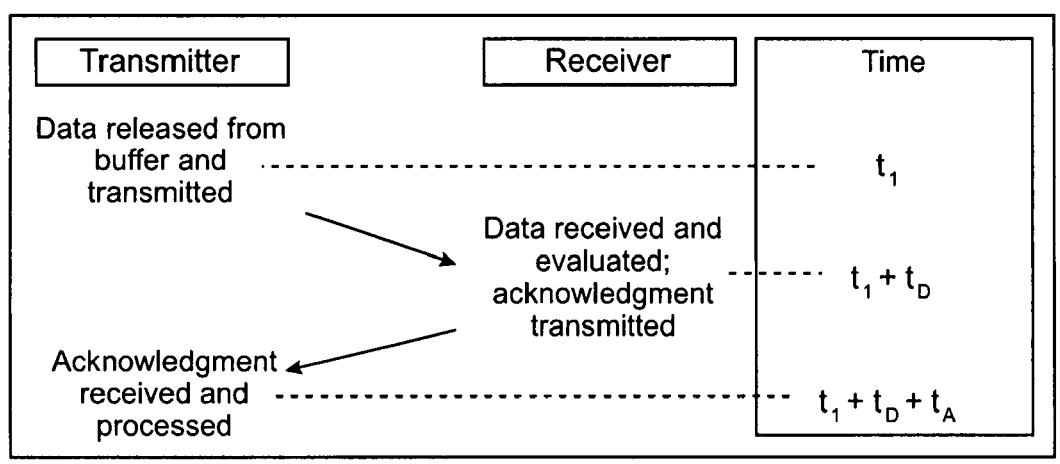
FIG. 18 is a diagram showing factors that affect calculation of a recommended retry-on-error timeout value in accordance with the present invention.

The minimum time must be sufficient for data to be sent from the packet buffer, to be received on the other side, to generate an acknowledgment packet, to send it back, and to have it be received and processed. These steps are illustrated in FIG. 18 and result in a minimum retry-on-error timeout $TO_{min}$ given by equations 34a and 34b.

$$TO_{min} = (t_1 + t_D + t_A) - t_1 \tag{34a}$$

$$= t_D + t_A \tag{34b}$$

The transit times $t_D$ and $t_A$ reflect latency in both the core itself and in the physical medium connecting the two ends of the link. Core latency ($t_C$) is a fixed property of the core and is out of the control of the user. The latency of the medium, referred to herein as wire latency ($t_W$), is under the control of the user. At the speeds in question, wire latency cannot be ignored—it may or may not be significant.

The timing model used by the logic design tool may treat the delays required to send and process a pause packet ($t_P$) as distinct from those required to send and process payload data ($t_D$). The difference is accounted for by core latency differences. The core latencies used can be specifically determined for the function in question. For example, the data latency used by the logic design tool need not reflect the full data latency from the input to the output of the data and priority ports, because the path in question is concerned solely with evaluating whether the packet was received correctly, and not beyond. As a result, we have the relationship of equations 35a and 35b.

$$t_D = t_{CD} + t_W \tag{35a}$$

$$t_A = t_{CA} + t_W \tag{35b}$$

Note that latency may not be deterministic. There may be some inherent variability of the latency of the FIFOs and other elements used in the design, and there may be uncertainty due to the link management packet queue and the fact that there may be two competing link management packets to be executed. The numbers below are an illustration, and assume the worst case for one suitable configuration. They do not try to account for the variability. Other suitable configurations may use different numbers and/or calculations.

The data core latency must account for the time it takes to transport data out of the buffer, through the transceiver onto the wire, then back off the wire, and the time it takes to have this data evaluated. CRC may add to the data latency. CRC may be considered separately because it is an optional feature. In another suitable configuration, other optional features might contribute to latency variability, and may have to be considered separately. Note that the CRC feature can be enabled in only one direction (from the local circuit to the remote circuit or from the remote circuit to the local circuit) or in both directions. From the perspective of the retry on error feature, CRC only enters into the latency during the evaluation of data. Therefore the CRC latency need only be included if CRC is enabled in the receive direction (or both directions).

Contributions to the total data core latency $t_{CD}$ are shown in FIG. 19 where, assuming $t_{CRC}$ takes on the value of 0 if CRC is not used in the receive direction, we have the relationship of equation 36.

$$t_{CD} = t_{Cd} + t_{CRC} \tag{36}$$

Acknowledgment core latency accounts for the amount of time taken to generate an acknowledgment packet, to transmit the packet onto the wire, to receive the packet back off of the wire, and to turn off the timer. In addition, if flow control is implemented in this embodiment, there may be some extra latency due to the fact that flow control takes precedence over retry if both are needed. The retry acknowledgment would be sent following the flow control packet in this situation.

Contributions to the total acknowledgment core latency are shown in FIG. 20 where, assuming $t_{FC}$ takes on the value 0 if flow control is not used, we have the relationship of equation 37.

$$t_{CA} = t_{Ca} + t_{FC} \tag{37}$$

A full retry timeout model for the logic design tool can be developed from the above, as shown in equations 38a, 38b, and 38c.

$$TO_{min} = (t_{CD} + t_W) + (t_{CA} + t_W) \tag{38a}$$

$$TO_{min} = (t_{CD} + t_{CA}) + 2t_W \tag{38b}$$

$$TO_{min} = (t_{Cd} + t_{CRC}) + (t_{Ca} + t_{FC}) + 2t_W \tag{38c}$$

Defining $t_C$ as the total core latency, not including the effect of CRC or flow control, yields equations 39a and 39b.

$$TO_{min} = (t_{Cd} + t_{Ca}) + t_{CRC} + t_{FC} + 2t_W \tag{39a}$$

$$TO_{min} = t_C + t_{CRC} + t_{FC} + 2t_W \tag{39b}$$

For the illustrative numbers in FIGS. 19 and 20, we can substitute 39 for $t_{Cd}$ and 33 for $t_{Ca}$, making $t_C$ 72, as shown in equation 39c.

$$TO_{min} = 72 + t_{CRC} + t_{FC} + 2t_W \tag{39c}$$

These contributions to the retry-on-error timeout can be summarized as shown in FIG. 21. The tool may allow the user to add some margin to the minimum timeout value. The margin entered will typically be a relatively small number, so in one suitable embodiment of the logic design tool, if a user enters a number greater than 50, the value is confirmed (but allowed).

Figure 22:
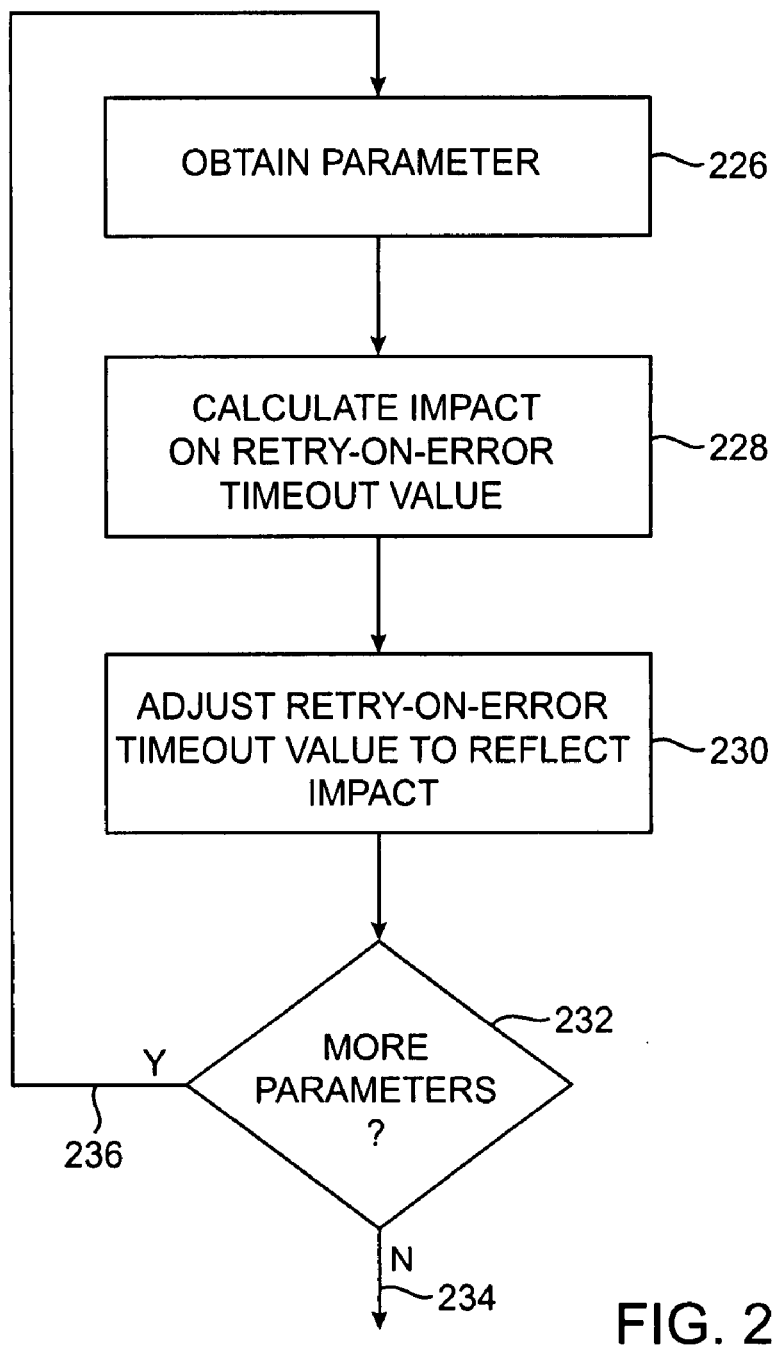
FIG. 22 is a flow chart of illustrative steps used by a logic design tool in calculating a recommended retry-on-error timeout value for a user in accordance with the present invention.

Illustrative steps involved in computing the retry-on-error timeout (e.g., using a retry-on-error aid module or modules within the logic design tool) are shown in FIG. 22. At step 226, logic design tool (e.g., the retry-on-error aid module in the logic design tool) obtains a parameter that affects the retry-on-error timeout value. The parameter may be an item entered by a user, may be a predetermined (or default) value, or may be a parameter derived from user and/or default values. Parameters that affect retry-on-error timeout are described in connection with equations 34–39 and include: bit rate, lane count, wire delay, packet/streaming mode (indirectly due to the fact that CRC is not available in streaming mode), CRC, and flow control.

At step 228, the logic design tool calculates the impact the parameter(s) will have on retry-on-error timeout and, at step 230, the retry-on-error timeout value is adjusted to reflect this calculation.

At step 232, the logic design tool determines whether the impact of additional parameters is to be taken into account. If not, the logic design tool proceeds to other processes via path 234. If additional parameters are to be taken into account, the retry-on-error timeout determination process loops back to step 226, as shown by path 236.

Any suitable graphical user interface may be used by the logic design tool to allow a user to design protocol-compliant integrated circuits. The graphical user interface may, for example, present the user with screens of clickable options and fillable boxes with which the user can interact to enter and adjust the parameters described in connection with equations 1–39 and FIG. 6.

An illustrative set of screens that the logic design tool (e.g., logic design tool 66 or other tools 62 of FIG. 4) may present to the user is shown in FIGS. 23–27. This arrangement is merely illustrative. Any suitable format and set of options may be presented to the user to allow the user to enter design preferences into the logic design tool.

Figure 23:
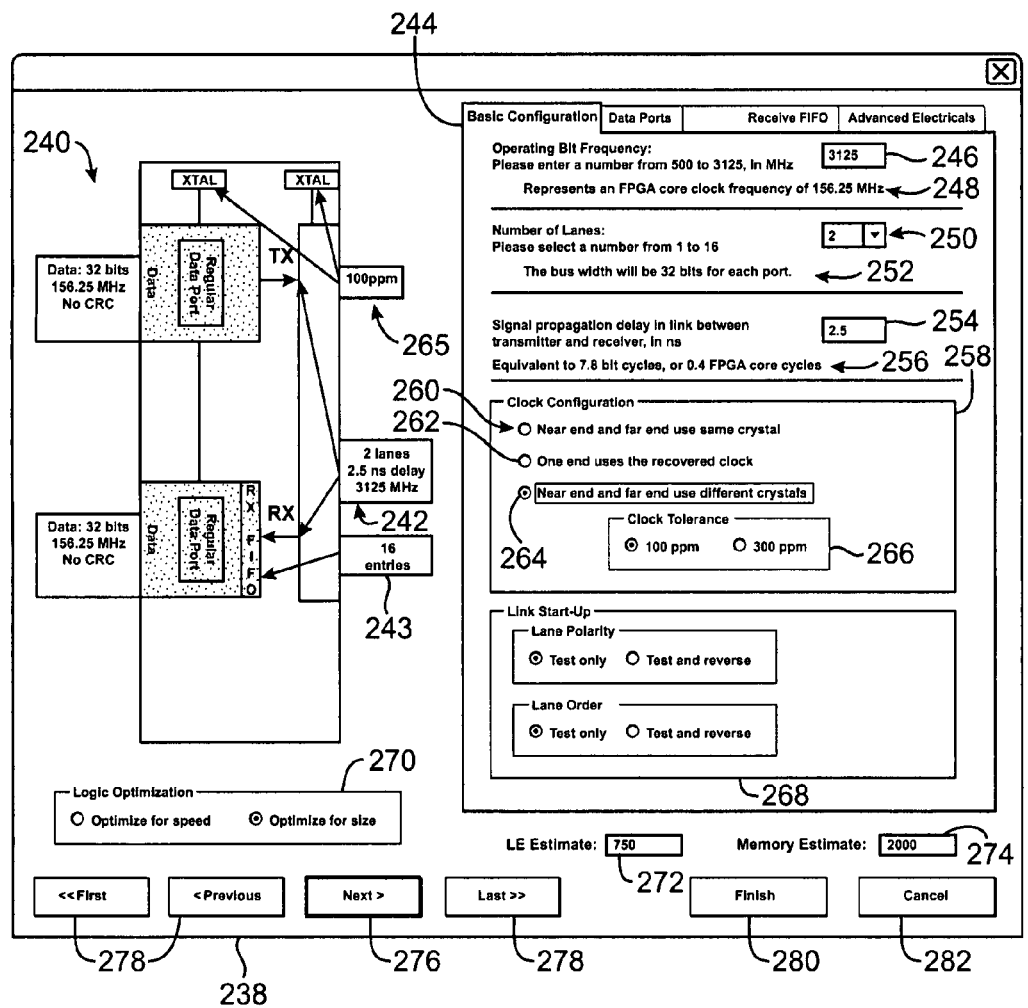
FIGS. 23–27 are illustrative screens that may be displayed for a user by a logic design tool in accordance with the present invention.

As shown in FIG. 23, the logic design tool may present a screen 238 that includes a graphics area 240. Graphics area 240 may include a graphical representation of the integrated circuit design specified by the user. For example, when a particular data rate is selected, that data rate may be reflected in the graphics area 240 (as shown by rate 242 in the example of FIG. 23). As another example, the clocking arrangement for the integrated circuit (e.g., a single local clock (XTAL) or separate clocks at the local and remote ends of the link) may be shown graphically. Area 243 may be used to display information on the number of slots contained in the FIFO (FIFO depth information). As features are selected and deselected, the logic design tool can update the contents of graphics area 240 in real time.

Option 270 may be used to select whether or not the logic design is to be optimized for speed (at the expense of size) or for size (at the expense of speed).

Boxes 272 and 274 may be updated in real time to reflect the logic design tool's current estimate of the amount of resources that will be consumed by the design (e.g., the number of logic elements and amount of memory that will be consumed in a programmable logic device design).

In FIG. 23, the basic configuration tab 244 has been selected by the user. The user may enter a desired data rate in box 246. The serial communications protocol may (for example) have an allowed data rate ranges of 622 to 3125 MHz or may have any other suitable allowed data rate. The logic design tool (and protocol) allow the user to select a highly-customized data rate (e.g., any data rate from 500 to 3125 MHz in integer values of MHz).

There is a predetermined relationship (e.g., a factor of 20×) between the data rate in box 246 that has been selected by the user and the calculated core clock frequency displayed at 248 by the logic design tool. The tool provides information 248 for the user's benefit (e.g., so that the user can decide which type of integrated circuit to use and which target data rate should be used for the user logic 112 on that chip).

The number of lanes in link 14 may be entered using option 250. The protocol may, for example, allow the user to enter a lane number of up to 256. The tool may request that the user enter a smaller number (e.g., 16) to ensure that the user does not run out of logic resources. The logic design tool may display information on the bus width (e.g., 16×N where N is the lane count) at 252.

Option 254 may be used to enter an expected wire delay (e.g., based on the known or expected layout to be used on a board in the system being designed). The logic design tool may convert this to an equivalent number of core clock cycles (e.g., by using the selected data rate to calculate a corresponding number of bit cycles and using the hardwired relationship between bit cycles and core cycles to calculate information 256.

The clock configuration option 258 may be used to select whether or not the local and remote integrated circuits will operate off of a common clock. Option 260 may be selected if a common clock is to be used. Option 262 may be selected if one end of the link 14 will use a recovered clock. Option 264 may be selected if the near and far end are to use different clocks. If option 264 is selected, the graphics 240 may be annotated with clock tolerance information 265. The user can select a desired clock tolerance using option 266.

Option 268 may be used to select options relating to link start up operations (e.g., whether or not to implement automatic lane polarity reversal and lane order reversal).

When the user is ready to proceed, the user can select next option 276. First, previous, and last options 278 may also be used for screen navigation. Finish option 280 may be selected to end the design process. Cancel option 282 allows the user to cancel a pending action.

Figure 24:
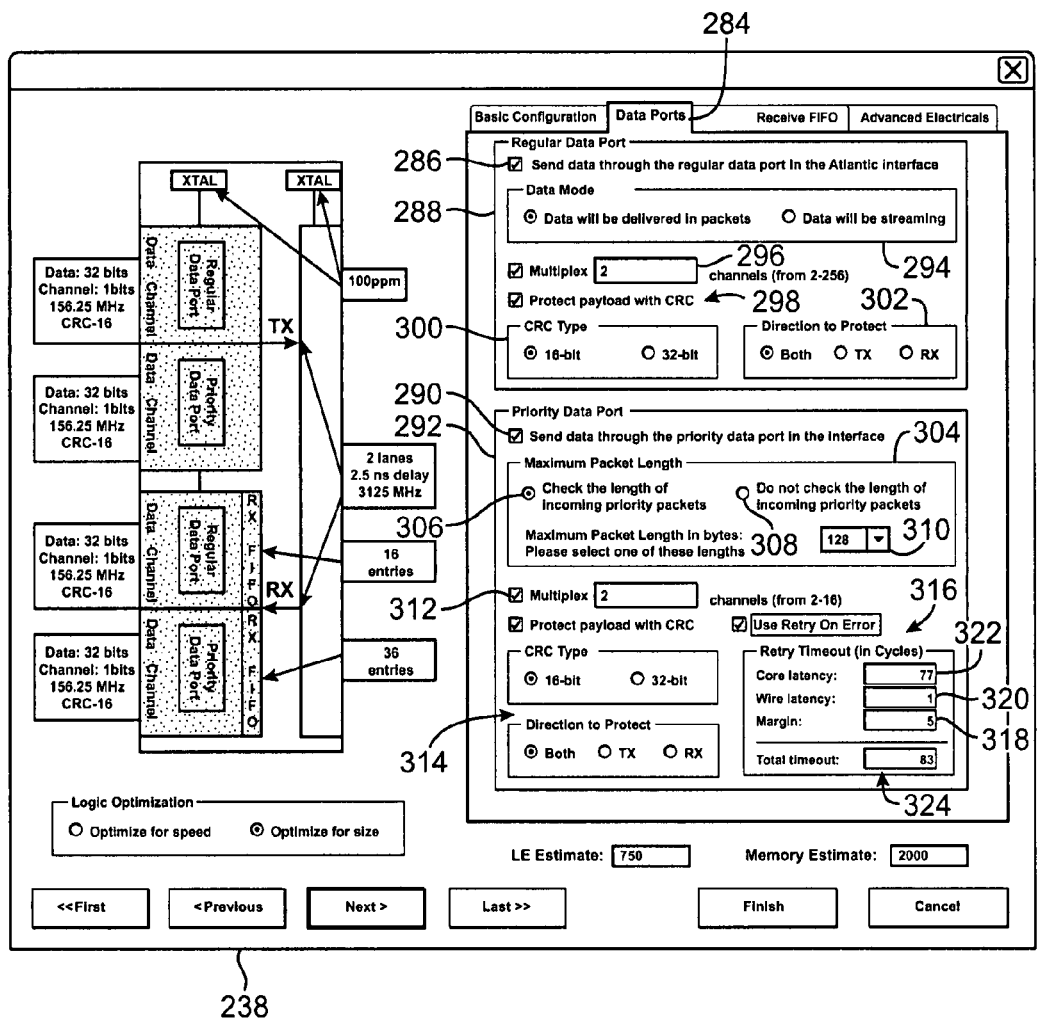

Information that may be displayed in screen 238 when the data ports tab 284 has been selected is shown in FIG. 24. The data ports screen of FIG. 24 allows the user to make design decisions related to the regular and priority data ports.

Regular data port option 288 has a box 286 that the user can select when it is desired to implement a regular data port in the design. Priority data port option 292 has a box 290 that the user can click on when it is desired to include a priority port in the integrated circuit being designed. The user may click box 286, box 290, or both boxes 286 and 290.

Data mode option 294 may be used to select packet or streaming data modes for the regular data port.

The user may implement user data channel multiplexing using option 296.

Option 298 may be used to protect (or not protect) the data with data integrity protection (e.g., CRC). Option 300 allows the user to select between CRC-16 and CRC-32. The user can protect either direction over the link 14, or may protect both directions by appropriate selection of the clickable options within box 302.

Option 304 may be used to adjust options related to maximum priority packet length. If option 306 is selected, the logic design tool may limit the user to maximum packet lengths of a certain size (e.g., multiples of the bus width). If option 308 is selected, the user may be provided with additional flexibility by not checking the length of incoming priority packets. Box 310 may be used to enter the maximum size (e.g., in bytes) for the priority data packets. In the example of FIG. 24, the maximum size is 128, which makes the transmitting circular buffer smaller. The protocol may limit the maximum packet length to 256 bytes.

Option 312 may be used for priority data channel multiplexing. Option 314 may be used in selecting how to implement priority data integrity protection.

Retry-on-error option 316 may be used to allow the user to enter, view, and adjust the retry-on-error timeout parameters described in connection with equations 34–39. For example, the user may enter a desired margin in box 318. The wire latency in box 320 may be provided from option 254 of FIG. 23. Core latency 322 is determined by the parameters discussed above. The resulting retry-on-error timeout value is displayed in box 324.

Figure 25:
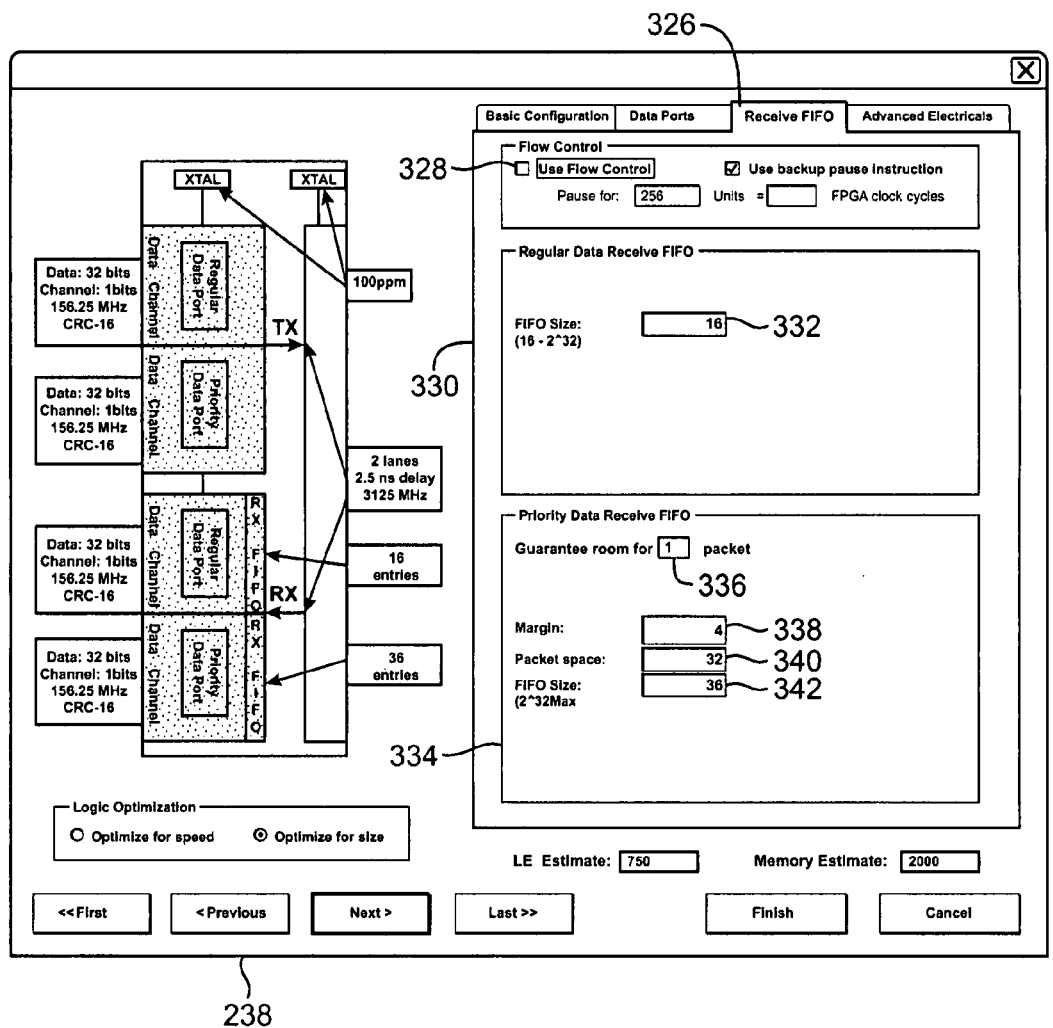
Figure 26:
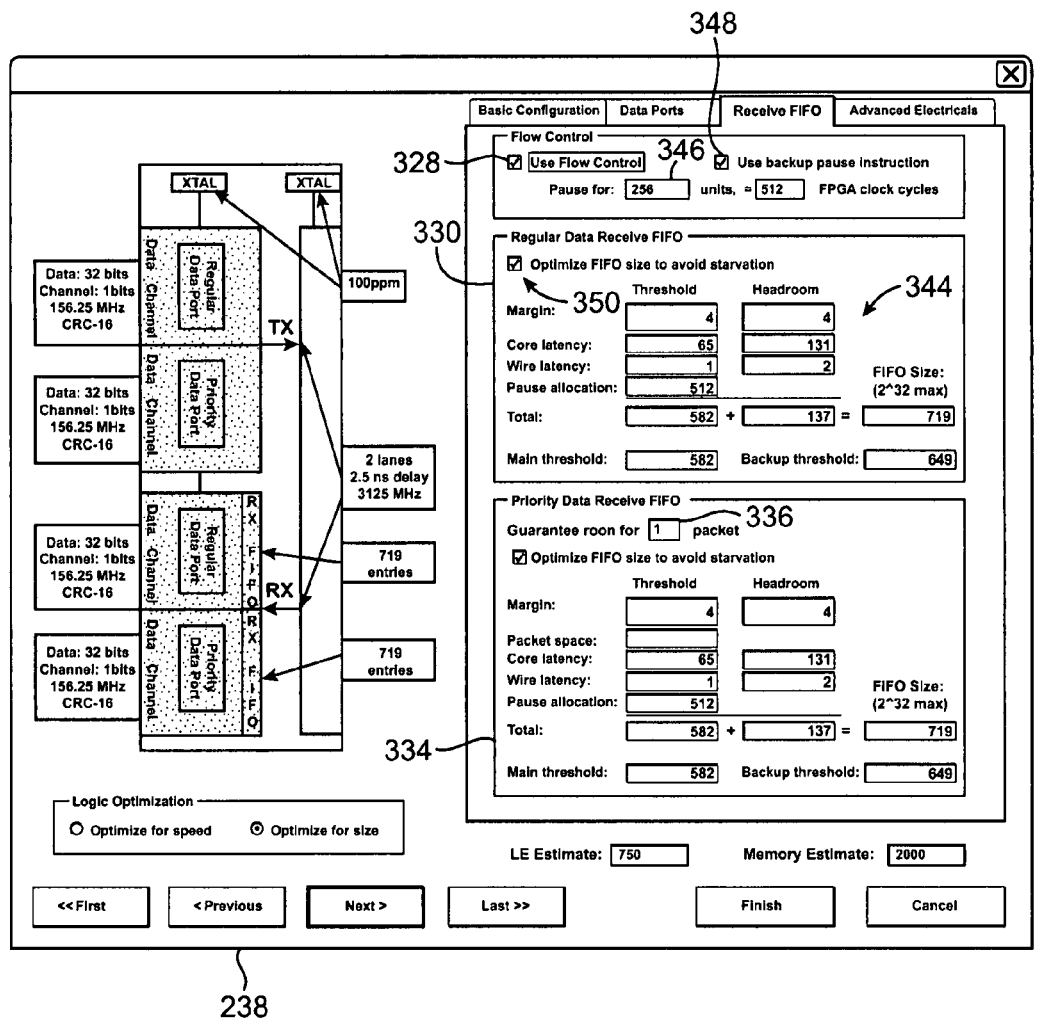

The receive FIFO may be configured using options of the type shown in FIGS. 25 and 26. The logic design tool may display screen 238 of FIG. 25 when configuring the integrated circuit without flow control. When the flow control feature is to be implemented, the logic design tool may display screen 238 of FIG. 26.

Screen 238 of FIG. 25 displays the receive FIFO tab 326. The use flow control option 328 is not checked in FIG. 25, indicating the flow control is not being implemented. Regular data receive FIFO option 330 contains a box 332 in which the size of the receive FIFO for the regular data port is displayed. This size may be dictated by a suitable preselected minimum value.

Option 334 may be used by the user to adjust parameters related to the priority data port receive FIFO. If the priority port is used, there must be room for at least one full packet in the receive FIFO to hold the packet while determining whether it is good or bad. This limitation arises from the retry-on-error feature, but may be used in connection with option 334 for the priority port (with and without retry-on-error). The amount of packet room to be reserved in the FIFO is entered in box 336. Margin option 338 may be used by the user to enter a desired margin. Option 340 may be used to display an automatically-determined packet space number (automatically determined by the packet size divided by two times the lane width, as an example). The resulting FIFO size may be displayed in box 342.

When flow control is implemented, the receive FIFO screen appears as shown by screen 238 of FIG. 26. Because the user has selected box 328, the user is provided with a box 346 that the user may use to specify a desired flow control pause value (in pause units each equal to two clock cycles). If the user selects option 348, the logic design tool sizes the FIFO accordingly (i.e., to reflect the additional logic used to implement a second FIFO threshold and used when sending a second pause instruction at the second threshold).

As shown in FIG. 26, option 330 contains additional entries 344, which provide options related to threshold and headroom (FIG. 7). The main and backup thresholds correspond to the locations in FIFO that trigger pause commands when exceeded. Depending on the options selected, information for main and backup threshold values may also be displayed. (Information on backup threshold may be hidden when backup pause is not used, but is automatically presented when the backup pause option 348 has been selected.)

Information on parameters such as core latency, wire latency, pause allocation are provided in entries 344. The user may select option 350 when it is desired to optimize the FIFO size to avoid starvation. Selecting option 350 brings the core latency, wire latency, and pause allocation entries 344 into view. The user can add margin using the margin box. If option 350 is not selected, the core latency, wire latency, and pause allocation values are set to zero and the user can enter a larger margin manually.

The screen 238 of FIG. 26 includes additional entries in priority data receive FIFO option 334. Option 334 is the same as option 330 (for the regular data receive FIFO) with the addition of the packet space option 336.

Figure 27:
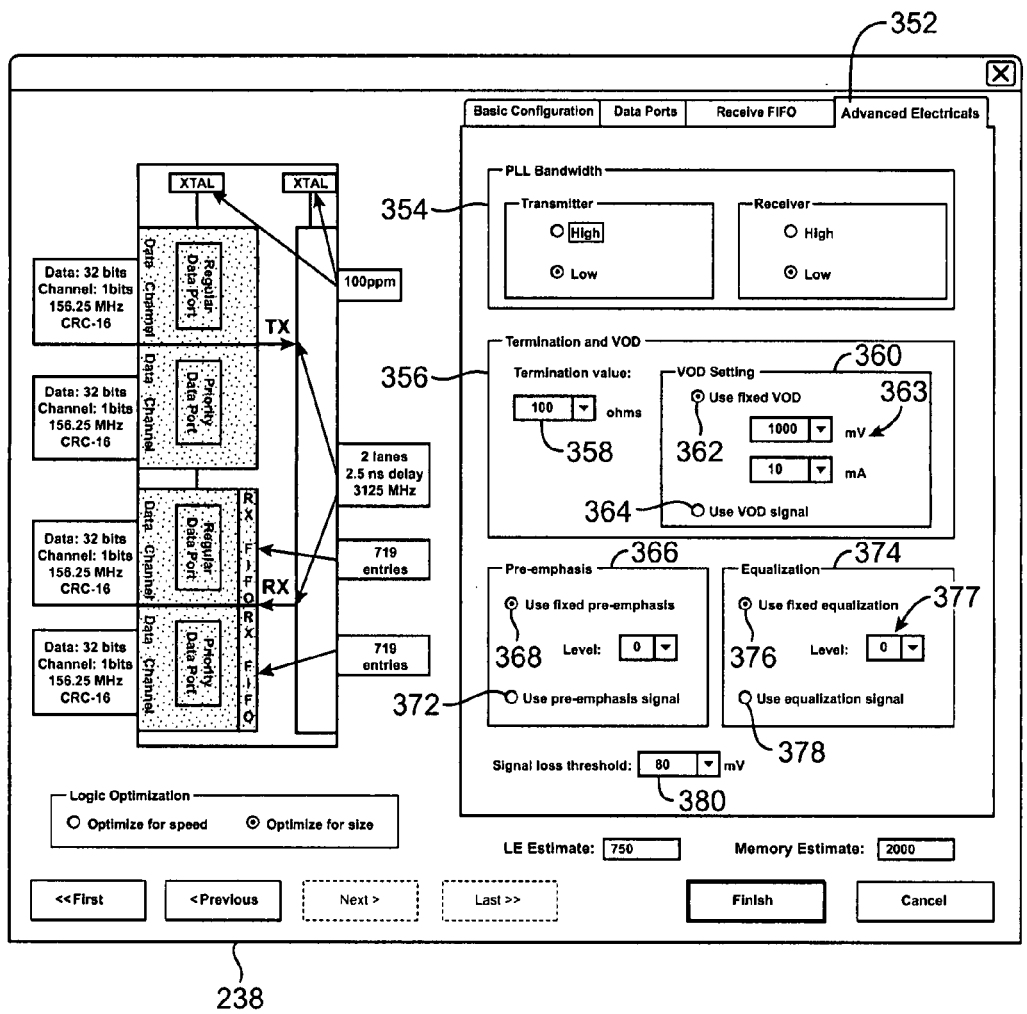

The logic design tool may also provide the user with options related to the transmitter circuitry 114 and receiver circuitry 116, as shown when the advanced electrical tab 352 of screen 238 of FIG. 27 is presented. In a programmable logic device or other integrated circuit containing programmable logic, different configuration bits in the transmitter and receiver circuitry will be set to adjust circuitry on the device appropriately, depending on which choices are made using the options of screen 238 at design time. These settings are not required in order to be compliant with the protocol, and may vary substantially both in terms of the specific settings available and the values that can be assigned to the settings if the circuits are realized on different programmable logic devices or other integrated circuits (processors, ASICs, etc.). Having the settings available with the other protocol settings allows the user to configure all aspects of high-speed communication in one place. If desired, the design entry aid 66 could be implemented without the transmitter and receiver settings. The following description is illustrative of one embodiment.

The PLL bandwidth option 354 of tab 352 allows the user to select a desired bandwidth for the transmitter's and receiver's phase-locked-loop circuitry (e.g., in the clock and data recovery circuitry 128 of FIG. 5). This allows the user to tailor how quickly the phase locked loop circuitry will lock and unlock to the core clock and how sensitive the phase-locked loop circuitry will be. If desired, delay-locked loop (DLL) circuitry can be used on an integrated circuit and option 354 can be used to select a desired DLL bandwidth.

Option 356 allows the user to make design decisions related to the termination of the link 14 and the peak-to-peak differential voltage swing on the differential wires in each lane ($V_{OD}$). A termination resistance (e.g., 100 ohms, 120 ohms, 150 ohms, etc.) may be selected using option 358. Option 360 may be used to adjust $V_{OD}$ settings. If option 362 is selected, the user may use boxes 363 to enter a desired fixed $V_{OD}$ (in terms of current or voltage as desired). Option 364 may be selected when it is desired to use an externally-supplied signal applied to appropriate pins on the integrated circuit to set the $V_{OD}$ value. Option 364 (and options 372 and 378 which function in the same way) may be particularly useful in a debugging context in which it is desired to make a series of adjustments to these parameters to determine optimum settings by trial and error.

Option 366 may be used to choose preemphasis settings. Preemphasis may be used to make the differential signals that are transmitted across the link 14 behave better in certain environments. A desired level of preemphasis may be selected by clicking on option 368 and using box 370 (e.g., to enter a preemphasis level such as level 1, level 2, etc.). Externally-supplied preemphasis signal settings may be used if option 372 is selected.

Equalization option 374 provides the user with an opportunity to use a fixed equalization value (using options 376 and 377) or to rely on settings provided through external pins (by selecting option 378).

The user can use option 380 to dictate how much a signal on the link 14 must drop before it is considered to no longer be a valid signal.

The foregoing is merely illustrative of the principles of this invention and various modifications can be made by those skilled in the art without departing from the scope and spirit of the invention.

What is claimed is:

1. A method for assisting a user in selecting an appropriate size for first-in-first-out circuitry (FIFO) with a computer-aided logic design tool, wherein the first-in-first-out circuitry is in receiver circuitry on an integrated circuit that is compliant with a serial communications protocol having optional data link layer features, comprising:
   with the computer-aided logic design tool, receiving input from the user that the user has provided to choose which optional data link layer features are to be included in the integrated circuit;
   calculating a recommended FIFO size based at least partly on which optional data link layer features were chosen to be included by the user; and
   displaying the recommended FIFO size for the user with the computer-aided logic design tool.

2. The method defined in claim 1 wherein the optional data link layer features comprise an optional cyclic redundancy check feature, the method further comprising:
   with the logic design tool, calculating the recommended FIFO size based at least partly on whether or not the user has used the logic design tool to choose the cyclic redundancy check feature for inclusion in the integrated circuit.

3. The method defined in claim 1 wherein the optional data link layer features comprise an optional priority data port feature, the method further comprising:
with the logic design tool, calculating the recommended FIFO size based at least partly on a maximum priority packet length provided to the logic design tool by the user.

4. The method defined in claim 1 wherein the optional data link layer features comprise an optional flow control feature, the method further comprising:
with the logic design tool, calculating the recommended FIFO size based at least partly on whether or not the user has used the logic design tool to choose the flow control feature for inclusion in the integrated circuit.

5. The method defined in claim 1 wherein the optional data link layer features comprise an optional retry-on-error feature, the method further comprising:
with the logic design tool, calculating the recommended FIFO size based at least partly on whether or not the user has used the logic design tool to choose the retry-on-error feature for inclusion in the integrated circuit.

6. The method defined in claim 1 wherein the optional data link layer features comprise an optional user data channel multiplexing feature, the method further comprising:
with the logic design tool, calculating the recommended FIFO size based at least partly on whether or not the user has used the logic design tool to choose the user data channel multiplexing feature for inclusion in the integrated circuit.

7. The method defined in claim 1 further comprising:
with the logic design tool, providing an on-screen option for the user that the user can select to direct the logic design tool to optimize the recommended FIFO size to avoid starvation of the FIFO.

8. The method defined in claim 1 further comprising:
with the logic design tool, determining the recommended FIFO size based at least partly on a user-entered margin value.

9. The method defined in claim 1 further comprising:
with the logic design tool, receiving information from the user on a desired threshold margin and a desired headroom margin for the FIFO; and
using the threshold margin and headroom margin to calculate the recommended FIFO size for the user.

10. The method defined in claim 1 wherein the logic design tool is used to design integrated circuits having a regular data port and a priority data port, the method further comprising:
calculating the recommended FIFO size based at least partly on a guaranteed room for packet value supplied to the logic design tool by the user.

11. The method defined in claim 1 further comprising calculating the recommended FIFO size based at least partly on a core latency value associated with the integrated circuit.

12. The method defined in claim 1 further comprising calculating the recommended FIFO size based at least partly on a wire latency value associated with a serial communications link over which the integrated circuit is to communicate.

13. The method defined in claim 1 further comprising calculating the recommended FIFO size based at least partly on a user-selected serial communications data rate for the integrated circuit.

14. The method defined in claim 1 further comprising calculating the recommended FIFO size based at least partly on a user-supplied margin value, wherein the optional data link layer features include a cyclic-redundancy check feature, a priority packet feature, a flow control feature, and a retry-on-error feature.

15. The method defined in claim 1 further comprising:
with the logic design tool, receiving input from the user that the user has provided to select whether or not the integrated circuit is to include an optional automatic lane order reversal feature.

16. The method defined in claim 1 further comprising:
with the logic design tool, receiving input from the user that the user has provided to select whether or not the integrated circuit is to use a flow control backup pause instruction in performing serial communications; and
with the computer-aided logic design tool, calculating the recommended FIFO size based at least partly on whether or not the user has used the logic design tool to choose the flow control backup pause instruction for inclusion in the integrated circuit.

17. A method for assisting a user in selecting an appropriate retry-on-error timeout value with a computer-aided logic design tool, wherein the retry-on-error timeout value is for an integrated circuit that is compliant with a serial communications protocol having optional data link layer features, comprising:
with the computer-aided logic design tool, receiving input from the user that the user has provided to choose which optional data link layer features are to be included in the integrated circuit;
calculating a recommended retry-on-error timeout value based at least partly on which optional data link layer features were chosen to be included by the user; and
displaying the recommended retry-on-error timeout value for the user with the computer-aided logic design tool.

18. The method defined in claim 17 further comprising:
with the logic design tool, receiving input from the user that the user has supplied to provide information on a serial communications link wire latency value; and
calculating the recommended retry-on-error timeout value based at least partly on the wire latency value.

19. The method defined in claim 17 wherein the optional data link features include an optional cyclic redundancy check feature, the method further comprising:
with the logic design tool, receiving input from the user that the user has provided to choose whether or not to include the optional cyclic redundancy check feature in the integrated circuit; and
calculating the recommended retry-on-error timeout value based at least partly on whether or not the user chose to include the cyclic redundancy check feature.

20. The method defined in claim 17 wherein the optional data link features include an optional streaming data feature, the method further comprising:
with the logic design tool, receiving input from the user that the user has provided to choose whether or not to include the optional streaming data feature in the integrated circuit; and
calculating the recommended retry-on-error timeout value based at least partly on whether or not the user chose to include the streaming data feature.

21. The method defined in claim 17 further comprising:
with the logic design tool, obtaining a margin value from the user; and
calculating the recommended retry-on-error timeout value based at least partly on the margin value from the user.

22. The method defined in claim 17 further comprising:
with the logic design tool, providing the user with options related to transmitter circuitry and receiver circuitry on the integrated circuit.

23. The method defined in claim 17 wherein receiving input from the user that the user has provided to choose which optional data link layer features are to be included in the integrated circuit comprises with the computer-aided logic design tool, receiving input from the user that the user has provided to choose whether to include a flow control feature in the integrated circuit.

* * * * *